United States Patent
Kienle et al.

(10) Patent No.: US 11,926,918 B2
(45) Date of Patent: Mar. 12, 2024

(54) COMPOSITION FOR METAL PLATING COMPRISING SUPPRESSING AGENT FOR VOID FREE FILING

(71) Applicant: BASF SE, Ludwigshafen am Rhein (DE)

(72) Inventors: Marcel Patrik Kienle, Limburgerhof (DE); Dieter Mayer, Ludwigshafen (DE); Marco Arnold, Ludwigshafen (DE); Alexandra Haag, Ludwigshafen (DE); Charlotte Emnet, Ludwigshafen (DE); Alexander Fluegel, Ludwigshafen (DE)

(73) Assignee: BASF SE, Ludwigshafen am Rhein (DE)

( * ) Notice: Subject to any disclaimer, the term of this patent is extended or adjusted under 35 U.S.C. 154(b) by 538 days.

(21) Appl. No.: 16/468,467

(22) PCT Filed: Dec. 19, 2017

(86) PCT No.: PCT/EP2017/083603
§ 371 (c)(1),
(2) Date: Jun. 11, 2019

(87) PCT Pub. No.: WO2018/114985
PCT Pub. Date: Jun. 28, 2018

(65) Prior Publication Data
US 2019/0309429 A1    Oct. 10, 2019

(30) Foreign Application Priority Data
Dec. 20, 2016   (EP) .................................... 16205553

(51) Int. Cl.
C25D 3/32      (2006.01)
C25D 3/02      (2006.01)
(Continued)

(52) U.S. Cl.
CPC ................ *C25D 3/32* (2013.01); *C25D 3/02* (2013.01); *C25D 3/38* (2013.01); *C25D 7/123* (2013.01); *H01L 21/2885* (2013.01)

(58) Field of Classification Search
None
See application file for complete search history.

(56) References Cited

U.S. PATENT DOCUMENTS 4,093,594 A * 6/1978 Anderson .............. C25D 13/06
                                                        524/901
4,146,442 A    3/1979 McFarland
(Continued)

FOREIGN PATENT DOCUMENTS

CN      102212305     * 10/2011   ............ C08G 18/32
DE    102011116764 A1 *  4/2013   ............ A01N 43/50
(Continued)

OTHER PUBLICATIONS

Gosecki et al. Polyglycidol, Its Derivatives, and Polyglycidol-Containing Copolymers-Synthesis and Medical Application, Polymers, 2016, 8, 227. (Year: 2016).*
(Continued)

*Primary Examiner* — Stefanie S Wittenberg
(74) *Attorney, Agent, or Firm* — Armstrong Teasdale LLP

(57) ABSTRACT

The invention relates to a polyamine-based or polyhydric alcohol-based suppressing agent. The suppressing agent is modified by reaction with a compound that introduces a branching group into the suppressing agent before they are reacted with an alkylene oxide. The suppressing agent shows extraordinary superfilling properties, particularly when used to fill in features having extremely small aperture sizes and/or high aspect ratios.

17 Claims, 9 Drawing Sheets

(51) Int. Cl.
  *C25D 3/38* (2006.01)
  *C25D 7/12* (2006.01)
  *H01L 21/288* (2006.01)

(56) References Cited

U.S. PATENT DOCUMENTS

| | | | |
|---|---|---|---|
| 4,347,108 A | 8/1982 | Willis | |
| 4,871,429 A | 10/1989 | Nobel et al. | |
| 6,444,110 B2 | 9/2002 | Barstad et al. | |
| 7,628,903 B1 | 12/2009 | Tsuji et al. | |
| 8,980,077 B2 | 3/2015 | Romer et al. | |
| 2002/0043467 A1 | 4/2002 | Morrissey et al. | |
| 2002/0127847 A1 | 9/2002 | Alling et al. | |
| 2004/0006055 A1* | 1/2004 | Winchell | A61K 31/33 514/184 |
| 2010/0004154 A1* | 1/2010 | Detering | C11D 3/3776 510/276 |
| 2011/0077376 A1* | 3/2011 | Tokumoto | C08G 18/4816 544/401 |
| 2011/0288230 A1* | 11/2011 | Bernard | C08G 71/04 524/590 |
| 2011/0290659 A1 | 12/2011 | Roeger-Göpfert et al. | |
| 2012/0018310 A1 | 1/2012 | Roeger-Goepfert et al. | |
| 2012/0024711 A1 | 2/2012 | Roeger-Goepfert et al. | |
| 2012/0027948 A1* | 2/2012 | Roeger-Goepfert | H01L 21/76877 427/430.1 |
| 2012/0128888 A1 | 5/2012 | Roeger-Goepfert et al. | |
| 2014/0097092 A1 | 4/2014 | Roeger-Goepfert et al. | |
| 2017/0233883 A1* | 8/2017 | Paneccasio, Jr. | H05K 3/424 438/667 |

FOREIGN PATENT DOCUMENTS

| | | | |
|---|---|---|---|
| EP | 0 854 206 A1 | 7/1998 | |
| JP | 4296358 B2 | 7/2009 | |
| WO | WO 2006/053242 A2 | 5/2006 | |
| WO | WO 2010/069810 A1 | 6/2010 | |
| WO | WO-2010069810 A1 * | 6/2010 | C08L 79/02 |
| WO | WO 2011/064154 A2 | 6/2011 | |
| WO | WO 2011/151785 A1 | 12/2011 | |
| WO | WO 2012/085811 A1 | 6/2012 | |
| WO | WO 2014/072885 A2 | 5/2014 | |
| WO | WO 2018/073011 A1 | 4/2018 | |

OTHER PUBLICATIONS

Extended European Search Report dated Jun. 20, 2017 in Patent Application No. 16205553.7, 3 pages.
International Preliminary Report on Patentability dated Jun. 25, 2019 in PCT/EP2017/083603 filed Dec. 19, 2017, 6 pages.
International Search Report dated Mar. 16, 2018 in PCT/EP2017/083603 filed Dec. 19, 2017.

* cited by examiner

COMPOSITION FOR METAL PLATING COMPRISING SUPPRESSING AGENT FOR VOID FREE FILING

The present invention relates to a composition for metal plating, particular copper electroplating, comprising metal ions and a suppressing agent.

BACKGROUND OF THE INVENTION

Filling of small features, such as vias and trenches, by metal, in particular copper electroplating is an essential part of the semiconductor manufacture process. It is well known, that the presence of organic substances as additives in the copper electroplating bath can be crucial in achieving a uniform metal deposit on a substrate surface and in avoiding defects, such as voids and seams, within the copper lines.

One class of additives are the so-called suppressors, suppressing agents or simply surfactants. Suppressors are used to provide a substantially bottom-up filling of small features like vias or trenches. The smaller the features are the more sophisticated the additives have to be to avoid voids and seams. In literature, a variety of different suppressing compounds have been described. The mostly used class of suppressors are polyether compounds like polyglycols or polyalkylene oxides like ethylene oxide propylene oxide copolymers.

U.S. Pat. No. 6,444,110 B2 discloses an electroplating solution which may comprise, besides a huge variety of additives called surfactants, nitrogen containing additives like ethoxylated amines, polyoxyalkylene amines, alkanol amines, amides like those provided by BASF under the trademark TETRONIC®.

US 2002/0043467 A1, US 2002/0127847 A1 and U.S. Pat. No. 4,347,108 A disclose, as suppressors, compounds provided by BASF under the trademark TETRONIC® or PLURONIC®.

WO 2006/053242 A1 discloses amine-based polyoxyalkylene suppressors. The amine may be methylamine, ethylamine, propylamine, ethylendiamine, diethylenetriamine, diaminopropane, diethyleneglykol diamin or triethylenglycol diamine. The copolymers may have block, alternating or random structure. Compounds provided by BASF under the trademark TETRONIC®, all of those being EO/PO block copolymers of ethylene diamine, and having a molecular mass of up to 5500 g/mol are described to be preferred. The block copolymers of EO and PO are used in the examples.

US 2012/018310 A1, US 2012/027948 A1, US 2012/024711 A1, and unpublished European patent application No. 16194900.3 disclose compositions comprising suppressors based on particular amine started polyalkoxyalkylene copolymers.

With further decreasing aperture size of the features like vias or trenches to dimensions of below 30 nanometers and even below 10 nanometers, respectively, the filling of the interconnects with copper becomes especially challenging, also since the copper seed deposition prior to the copper electrodeposition might exhibit inhomogeneity and non-conformity and thus further decreases the aperture sizes particularly at the top of the apertures. Especially apertures with a seed overhang at the top opening or convex-shaped apertures are challenging to fill and require an especially effective copper growth suppression at the side wall of the feature and the opening of the aperture.

Other metals like cobalt are discussed to be an alternative to copper.

On the other hand, metals and metal-alloys are commercially important, particularly in the electronics industry where they are often used as electrical contacts, final finishes and solders. Certain applications for lead-free solder plating present challenges in the electronics industry. For example, when used as a capping layer on copper pillars, a relatively small amount of lead-free solder, such as tin or tin-silver solder, is deposited on top of a copper pillar. In plating such small amounts of solder it is often difficult to plate a uniform height of solder composition on top of each pillar, both within a die and across the wafer. The use of known solder electroplating baths also results in deposits having a relatively rough surface morphology. There is also a need to provide a metal, particularly a tin or tin alloy electroplating bath for defect-free filling of bigger features like solder bumps or micro bumps that have a smooth surface and uniform (coplanar) height.

Even if there exist many types of amine started polyalkoxyalkylene copolymer suppressors there is still a need for suppressors which are capable of filling features having aperture sizes of 15 nm, particularly 10 nm or below.

It is therefore an object of the present invention to provide a metal electroplating additive, in particular a suppressing agent capable of providing a substantially voidless and seamless filling of features on the nanometer and on the micrometer scale with a metal electroplating bath, preferably a copper, tin or tin alloy electroplating bath.

It is a further object of the present invention to provide a metal electroplating additive capable of providing a substantially voidless and seamless filling of features having a convex shape. It is a further object of the present invention to provide a suppressing agent that provides bottom-up fill capability, particularly into features having an aperture size of up to 200 nm. Furthermore, it is important to provide suppressors that are compatible with a wide range of copper and acid concentrations, in particular low copper and/or low acid electroplating compositions.

It is a further object of the present invention to provide a metal, particularly tin or tin alloy electroplating composition that provides metal deposits showing a good morphology, particularly a low roughness and which is capable of filling features on the micrometer scale without substantially forming defects, such as but not limited to voids. It is further an object of the invention to provide a tin or tin alloy electroplating bath that provides a uniform and planar tin or tin alloy deposit, in particular in features of 1 micrometer to 200 micrometer widths.

SUMMARY OF THE INVENTION

Surprisingly, it has now been found, that the use of polyamine-based or polyhydric alcohol-based suppressing agents which are modified by reaction with a compound, such as but not limited to glycidole or glycerol carbonate, that introduce a branching group into the suppressing agent before they are reacted with alkylene oxides show extraordinary superfilling properties, particularly when used to fill in features having extremely small aperture sizes and/or high aspect ratios. The present invention provides a new class of highly effective, strong suppressing agents that cope with the seed overhang issue and provide substantially defect free trench filling despite a non-conformal metal seed.

Furthermore, due to the suppressing effect of the suppressing agents dendrite growth is inhibited and smaller grain sizes and smoother surfaces are obtained with improved coplanarity.

Therefore, the present invention provides an aqueous composition comprising metal ions and at least one compound of formula I $$R^{11}-N{\underset{R^{13}}{|}}{\left(-X^1-N{\underset{R^{14}}{|}}\right)_n}R^{12} \quad (I)$$

or formula II $$R^{21}-C{\underset{R^{25}}{\overset{R^{23}}{|}}}{\left(-X^2-C{\underset{R^{26}}{\overset{R^{24}}{|}}}\right)_m}R^{22} \quad (II)$$

wherein $X^1$ is selected from a linear or branched $C_1$-$C_{12}$ alkanediyl, which may be substituted or unsubstituted, and which may optionally be interrupted by O, S or $NR^{40}$;

$X^2$ is selected from (a) a chemical bond or (b) a linear or branched $C_1$-$C_{12}$ alkanediyl, which may be substituted or unsubstituted, and which may optionally be interrupted by O or S;

$R^{11}$ is selected from Z, $X^5$—Z, and $X^4$—$N(Z)_2$;

$R^{21}$ is selected from O—Z, O—$X^5$—Z and $X^4$—O—Z;

Z is a branching group of formula III $$\text{(III)}$$

$R^{12}$, $R^{13}$, $R^{14}$ are (a) selected from H, $R^{11}$, $R^{40}$, or
 (b) $R^{13}$ and an adjacent group $R^{14}$ or, if n>2, two adjacent groups $R^{14}$ may together form a bivalent group $X^{13}$;

$R^{22}$, $R^{23}$, $R^{24}$ are selected from H, $R^{21}$, $X^4$—$R^{21}$, O—$R^{40}$, $X^4$—O—$R^{40}$, and $R^{40}$;

$R^{25}$, $R^{26}$ are selected from H, $R^{21}$, $X^4$—$R^{21}$, O—$R^{40}$, $X^4$—O—$R^{40}$, and $R^{40}$;

$R^{31}$, $R^{32}$ are independently selected from (a) a monovalent $C_2$ to $C_6$ polyoxyalkylene group, (b) a further branching group to form a multiple branching group $(Z^p)_p(R^{31}R^{32})_{2p}$, or (c) $X^5$—Z;

$Z^p$ is selected from or $R^{40}$ is selected from (a) linear or branched $C_1$-$C_{20}$ alkyl, which may optionally be substituted by hydroxyl, alkoxy or alkoxycarbonyl, and (b) linear or branched $C_1$-$C_{20}$ alkenyl, which may optionally be substituted by hydroxyl, alkoxy or alkoxycarbonyl;

$X^3$ is a linear or branched $C_1$ to $C_{12}$ alkanediyl, which may be interrupted by O and S atoms or substituted by O—$R^{31}$;

$X^4$ is a linear or branched $C_1$ to $C_{12}$ alkanediyl;

$X^5$ is a divalent group selected from at least one $C_2$ to $C_6$ polyoxyalkylene;

$X^{13}$ is selected from a linear or branched $C_1$-$C_{12}$ alkanediyl, which may optionally be interrupted by 0, S or $NR^{40}$;

n is an integer of from 1 to 6; and m is an integer of from 0 to 6; and p is an integer of from 2 to 4.

The invention further relates to the use of a metal plating bath comprising a composition as defined herein for depositing the metal, particularly copper, on substrates comprising features having an aperture size of 30 nanometers or less, in particular 20 nm or less, 15 nm or less or even 10 nm or less and/or an aspect ratio of 4 or more.

The invention further relates to the use of a metal plating bath comprising a composition as defined herein for depositing the metal, particularly tin or tin alloy, on substrates comprising features having an aperture size of 500 nm to 500 μm, particularly 1 to 200 μm.

The invention further relates to a process for depositing a metal layer on a substrate comprising nanometer-sized features by
 a) contacting a composition as defined herein with the substrate, and
 b) applying a current to the substrate for a time sufficient to deposit a metal layer onto the substrate,
wherein the substrate comprises nanometer sized features and the deposition is performed to fill the micrometer or nanometer sized features.

In this way suppressing agents are provided that result in a extraordinarily pronounced bottom-up fill metal, particularly copper growth while perfectly suppressing the sidewall metal growth, both leading to a flat growth front and thus providing substantially defect free trench or via fill. The strong sidewall metal growth suppression of the invention enables non-conformal metal seeded features to be substantially void free filled. Moreover the invention provides an overall homogeneous bottom-up fill in neighboring features of dense feature areas.

The suppressing agents according to the present invention are particularly useful for filling of small recessed features, particularly those having aperture sizes of 30 nanometer or below.

The suppressing agents according to the present invention are also particularly useful for filling of recessed features having aperture sizes of 500 nm to 500 μm, particularly those having aperture sizes of 1 to 200 μm.

DETAILED DESCRIPTION OF THE INVENTION

Suppressors According to the Invention

Figure 1:
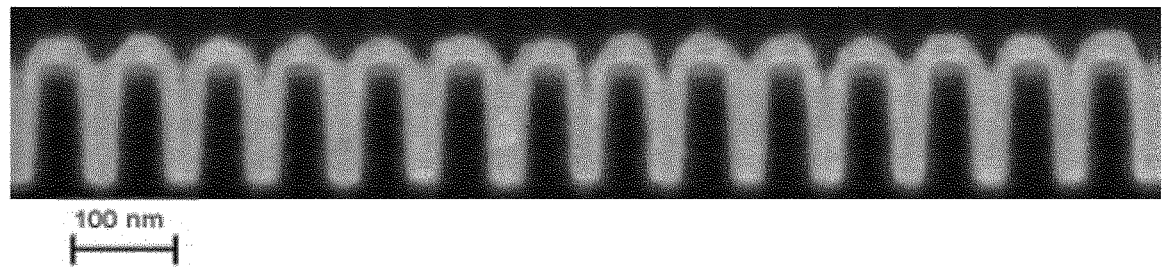
FIG. 1 shows a SEM image of partly filled trenches after copper electroplating according to example B1.

It was found that compositions for metal electroplating according to the invention comprising at least one suppressing agent as described below show extraordinary performance in micrometer or nanometer sized feature filling.

Besides metal ions the aqueous composition according to the present invention comprises at least one compound of formula I

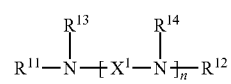

or formula II

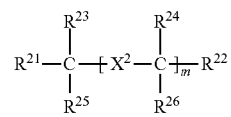

The compounds of formula I with $R^{11}$=Z may be prepared in two steps. First, a multi amine is reacted with a compound that introduces a branching group (further also referred to a "branching agent"), such as but not limited to an epoxide

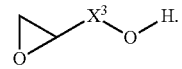

or a carbonate ester of formula

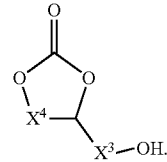

In a second step the reaction product is reacted with one or more alkylene oxides to form the respective amine-based suppressing agents according to the invention.

If $R^{11}$ is $X^5$—Z, a three-step process is required. In a first step the amine starter is reacted with a first portion of the alkylene oxides followed by reaction with the compound that introduces a branching group and afterwards again with a second portion of the alkylene oxides as described above.

The compounds of formula II may also be prepared in two or three steps. First, a polyhydric alcohol starter is reacted with the epoxide or carbonate ester, which is then reacted with the alkylene oxides to form the respective alcohol-based suppressing agents according to the invention. Such reactions are generally known in the art and further described in the embodiments and the examples. If $R^{21}$=$X^5$—O—Z also here, the starter is first reacted with a first portion of alkylene oxides followed by reaction with the compound that introduces a branching group and afterwards with a second portion of the alkylene oxides as described above.

Generally, n may be an integer of from 1 to 6. Preferably n is an integer from 0 to 4, most preferably n is 0, 1 or 2.

Generally, m may be an integer of from 0 to 6. In formula II, if n=0, $R^{21}$ must not be O—Z to start from a stable polyhydric alcohol. Preferably m is an integer from 0 to 4, most preferably m is 0, 1, 2 or 3.

$X^1$ is a spacer group within the polyamine starter. It may be a linear or branched $C_1$-$C_{12}$ alkanediyl, which may be substituted or unsubstituted, preferably unsubstituted. Such alkanediyl spacer may optionally be interrupted by O, S or $NR^{40}$. In a first preferred embodiment $X^1$ is a $C_1$-$C_6$ alkanediyl, more preferably $C_1$-$C_4$ alkanediyl, most preferably methanediyl, ethanediyl or propanediyl. In a second preferred embodiment heteroatoms are present and $X^1$ may be $—(CH_2)_q\text{-}[Q\text{-}(CH^2)_r]_s—$, with Q being selected from O, S or $NR^{40}$ and q+r s is the number of C atoms in the spacer. Particularly preferred is a spacer with Q=O and p=r=1 or 2, and r=1.

$X^2$ is a chemical bond or spacer group within the polyhydric alcohol starter. The spacer may be a linear or branched $C_1$-$C_{12}$ alkanediyl. Such alkanediyl spacer may optionally be interrupted by O, S or $NR^{40}$. In a first preferred embodiment $X^1$ is a $C_1$-$C_6$ alkanediyl, more preferably $C_1$-$C_4$ alkanediyl, most preferably methanediyl, ethanediyl or propanediyl. In a second preferred embodiment heteroatoms are present and $X^1$ may be $—(CH_2)_q\text{-}[Q\text{-}(CH^2)_r]_s—$, with Q being selected from O, S or $NR^{40}$ and q+r s is the number of C atoms in the spacer. Particularly preferred is a spacer with Q=O and p=r=1 or 2, and r=1.

In a preferred embodiment $X^1$ and $X^2$ are free of chlorine (Cl) substituents.

As used herein, "chemical bond" means that the respective moiety is not present but that the adjacent moieties are bridged so as to form a direct chemical bond between these adjacent moieties. By way of example, if in X—Y—Z the moiety Y is a chemical bond then the adjacent moieties X and Z together form a group X—Z.

Generally, $R^{11}$ and $R^{21}$ are independently selected from Z, or $X^5$—Z or $X^4$—$N(Z)_2$ with Z being a branching group of formula III

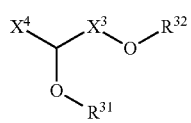

(III)

Preferably $R^{11}$ is selected from Z. If $R^{11}$ is selected from $X^5$—Z. Preferably $X^5$ has a degree of alkoxylation of from 1 to 100, more preferably of from 2 to 70. If $R^{11}$ and $R^{21}$ are selected from $X^4$—$N(Z)_2$, $X^4$ is preferably selected from a $C_1$ to $C_4$ alkanediyl group or $(CH_2)_p$—O—$(CH_2)_r$, with p and r being independently selected from 1, 2 or 3, preferably 1 or 2. Most preferably p is the same as r.

$R^{12}, R^{13}, R^{14}$ either selected from H, $R^{11}, R^{40}$, or $R^{13}$ and an adjacent group $R^{14}$ or, if n>2, two adjacent groups $R^{14}$ may together form a bivalent group $X^{13}$. In the latter case $X^{13}$ is selected from a linear or branched $C_1$-$C_{12}$ alkanediyl, which may optionally be interrupted by O, S or $NR^{40}$. Preferably $X^{13}$ is selected from a linear or branched $C_1$-$C_6$ alkanediyl, more preferably from a $C_1$-$C_4$ alkanediyl, most preferably from methyl or ethyl or propyl. In this case $X^1$ is preferably selected so as to form a 5 or 6 membered ring system.

$R^{21}$ is selected from O—Z, O—$X^5$—Z and $X^4$—O—Z. Preferably $R^{21}$ is selected from O—Z. If $R^{21}$ is selected from O—$X^5$—Z, preferably $X^5$ has a degree of alkoxylation of from 1 to 100, more preferably of from 2 to 70. If $R^{11}$ and $R^{21}$ are selected from $X^4$—$N(Z)_2$, $X^4$ is preferably selected from a $C_1$ to $C_4$ alkanediyl group or $(CH_2)_p$—O—$(CH_2)_r$, with p and r being independently selected from 1, 2 or 3, preferably 1 or 2. Most preferably p is the same as r.

$R^{22}, R^{23}, R^{24}$ are selected from H, $R^{21}, X^4$—$R^{21}$, O—$R^{40}$, $X^4$—O—$R^{40}$, and $R^{40}$. $R^{25}, R^{26}$ are selected from H, $R^{21}$, $X^4$—$R^{21}$, O—$R^{40}$, $X^4$—O—$R^{40}$, and $R^{40}$.

In a first embodiment $R^{31}$ and $R^{32}$ are monovalent groups independently selected from at least one $C_2$ to $C_6$ polyoxyalkylene group (hereinafter also referred to as polyalkylene oxide). The $C_2$ to $C_6$ polyoxyalkylene group may be prepared from the respective alkylene oxide. Preferably the at least one $C_2$ to $C_6$ polyoxyalkylene group is selected from polyoxyethylen (prepared from ethylene oxide), polyoxypropylene (prepared from propylene oxide), and polyoxybutylene (prepared from butylene oxide). More preferably the polyoxyalkylene group in $R^{31}, R^{32}$ are a copolymer of ethylene oxide and at least one further $C_3$ to $C_6$ alkylene oxide. The further alkylene oxide is preferably selected from propylene oxide and 1,2-butylene oxide or any isomers thereof. In another preferred embodiment the $C_3$ to $C_4$ alkylene oxide is selected from propylene oxide (PO). In this case EO/PO copolymer side chains are generated from the starting molecule. Such copolymers of ethylene oxide and at least one further alkylene oxide may have random, block, alternating or any other arrangement.

In a second embodiment, if a further branching is required, a further branching group may be present in $R^{31}$ and/or $R^{32}$ to form a multiple branching group $(Z^p)_p(R^{31} R^{32})_{2p}$. Here $Z^p$ is either selected from

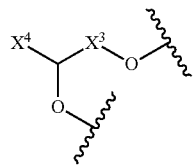

or from

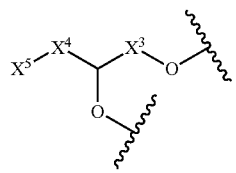

which are both trivalent fragments of Z. Here p is an integer of from 2 to 4, which means that 2, 3 or 4 Z fragments may be incorporated in the suppressor in order to establish 4, 6 or 8 branches per NH or OH group in the starter. Preferably p is 2 or 3, most preferably 2. In the first alternative such compounds may be prepared by reacting a molar access of the branching compound with the respective polyamine or polyhydric alcohol starter. In this case the branching groups are adjacent to each other. This may be repeated up to an amount of p branching groups. In the second alternative such compounds may be prepared by reacting up to an equimolar amount of the branching agent in a first step, then reacting the product received with the at least one $C_2$-$C_6$ alkylene oxide to form group $X^5$ in a second step, then again reacting the product received in the second step with the branching group, followed by a reaction with the at least one $C_2$-$C_6$ alkylene oxide to form groups $R^{31}$ and $R^{32}$. This may also be repeated up to an amount of p branching groups. "Equimolar" here means that all NH or OH groups are reacted with the branching agent.

In one embodiment $R^{40}$ is selected from linear or branched $C_1$-$C_{20}$ alkyl, which may optionally be substituted by hydroxyl, alkoxy or alkoxycarbonyl. In another embodiment $R^{40}$ is selected from linear or branched $C_1$-$C_{20}$ alkenyl, which may optionally be substituted by hydroxyl, alkoxy or alkoxycarbonyl. Preferably $R^{40}$ is $C_1$-$C_{10}$ alkyl, even more preferably $C_1$-$C_6$ alkyl, most preferably methyl, ethyl or propyl.

$X^3$ is a linear or branched $C_1$ to $C_{12}$ alkanediyl, which may be interrupted by O and S atoms or substituted by O—$R^{31}$. Preferably $X^3$ is a $C_1$ to $C_6$ alkanediyl, more preferably methanediyl, ethanediyl, propanediyl or butanediyl, most preferably methanediyl or ethanediyl.

$X^4$ is a linear or branched $C_1$ to $C_{12}$ alkanediyl. Preferably $X^3$ is a $C_1$ to $C_6$ alkanediyl, more preferably methanediyl, ethanediyl, propanediyl or butanediyl, most preferably methanediyl or ethanediyl.

$X^5$ is a divalent group which are selected from at least one $C_2$ to $C_6$ polyoxyalkylene group (hereinafter also referred to as polyalkylene oxide). The $C_2$ to $C_6$ polyoxyalkylene group may be prepared from the respective alkylene oxide. Preferably the at least one $C_2$ to $C_6$ polyoxyalkylene group is selected from polyoxyethylen (prepared from ethylene oxide), polyoxypropylene (prepared from propylene oxide, and polyoxybutylene (prepared from butylene oxide). More preferably the polyoxyalkylene group in $X^5$ is a copolymer of ethylene oxide and at least one further $C_3$ to $C_6$ alkylene oxide. The further alkylene oxide is preferably selected from propylene oxide and 1,2-butylene oxide or any isomers thereof. In another preferred embodiment the $C_3$ to $C_4$ alkylene oxide is selected from propylene oxide (PO). In this case EO/PO copolymer side chains are generated from the starting molecule. Such copolymers of ethylene oxide and at least one further alkylene oxide may have random, block, alternating or any other arrangement.

As used herein, "random" means that the comonomers are polymerized from a mixture and therefore arranged in a statistically manner depending on their copoymerization parameters.

As used herein, "block" means that of comonomers are polymerized after each other to form blocks of the respective co-monomers in any predefined order. By way of example, for EO and propylene oxide (PO) comonomers such blocks may be, but are not limited to: -$EO_x$-$PO_y$-, —$PO_x$-$EO_y$-, -$EO_x$-$PO_y$-$EO_x$-, —$PO_x$-$EO_y$-$PO_x$-, etc. Preferred block-type alkylene oxides are —$PO_x$-$EO_y$-, and -$EO_x$-$PO_y$-$EO_z$- wherein x is in the range of 2 to 300, y is in the range of 2 to 300, and z is in the range of 2 to 300.

For copper or cobalt electroplating, in $R^{31}$, $R^{32}$ and $X^5$ the content of ethylene oxide in the alkylene oxide copolymers may generally be from 5 to 95% by weight. Preferably the content of ethylene oxide in $R^{31}$, $R^{32}$ and $X^5$ is from 20 to 80% by weight, even more preferably from 25 to 70% by weight, most preferably from 30 to 60% by weight, all based on the total amount of alkylene oxides in the additive (i.e. without polyamine or polyhydric alcohol starter and further modifications by the branching agent).

For tin or tin alloy electroplating, $R^{31}$, $R^{32}$ and $X^5$ the content of ethylene oxide may generally be from 3 to 95% by weight. Preferably the EO content is from 5 to 80% by weight, more preferably from 5 to 60% by weight, even more preferably below 50% by weight, even more preferably below 40% by weight, even more preferably from 5 to 40% by weight, even more preferably from 5 to 30% by weight, even more preferably from 6 to 25% by weight, most preferably from 8 to 20% by weight.

Generally, the molecular weight $M_w$ of the suppressing agent may be from about 500 to about 25000 g/mol, preferably 2000 to 15000 g/mol. In one embodiment the molecular weight $M_w$ of the suppressing agent is from about 500 to about 8000 g/mol, preferably from about 1000 to about 6000 g/mol, most preferably from about 1500 to about 3500 g/mol. In another preferred embodiment the molecular weight $M_w$ of the suppressing agent is from about 5000 to about 20000 g/mol, in particular from about 6000 to about 15000 g/mol.

In a first preferred embodiment a compound of formula I is used in which n is 0 and $R^{11}$, $R^{12}$ and $R^{13}$ are independently selected from $X^4$—$N(Z)_2$. Preferably, $X^4$ is selected from methanediyl, ethanediyl, or propanediyl. Most preferably $X^4$ is ethanediyl. Preferably $X^4$ is selected from a $C_1$ to $C_6$ alkanediyl, more preferably a $C_1$ to $C_4$ alkanediyl, most preferably methanediyl, ethanediyl and propanediyl. Such compounds may be prepared by starting from a tris(aminoalkyl) amine such as but not limited to tris(aminomethyl) amine, tris(aminoethyl) amine, tris(aminopropyl amine, and the like.

In a second preferred embodiment a compound of formula Ia

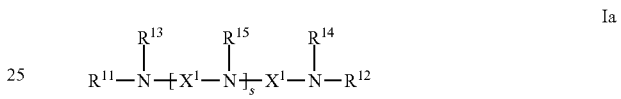

is used, wherein s is 0, 1, 2 or 3, most preferably 0 or 1; $R^{11}$, $R^{12}$, $R^{13}$ and $R^{14}$ are selected from Z; and $R^{15}$ is selected from $R^{11}$ and $R^{40}$. Such compounds may be prepared by starting from symmetric alkylenediamines, dialkylentriamines or trialkylenetetramines, such as but not limited to ethylenediamine, diethylentriamine, triethylenetetramine, propylenediamine, dipropylentriamine, tripropylentetramine, methyl diethylentriamine, dimethyl triethylenetetramine, and the like.

In a third preferred embodiment a compound of formula Ia is used, wherein s is 0, 1, 2 or 3, preferably 0 or 1, most preferably 1; $R^{11}$ and $R^{12}$ are selected from Z; $R^{13}$ and $R^{14}$ are selected from $R^{40}$; and $R^{15}$ is selected from $R^{11}$ or $R^{40}$. Such compounds may be prepared by starting from symmetrically $C_1$-$C_6$-alkyl substituted alkylenediamines, dialkylentriamines or trialkylenetetramines, such as but not limited to N,N-dimethyl ethylenediamine, N,N-diethyl ethylenediamine, N,N-dipropyl ethylenediamine, N,N,N-trimethyl diethylenetriamine, and the like.

In a fourth preferred embodiment a compound of formula Ia is used, wherein s is 0, 1, 2 or 3, preferably 0 or 1, most preferably 0; $R^{11}$ and $R^{13}$ are selected from Z; $R^{12}$, $R^{14}$, and $R^{15}$ are selected from $R^{40}$. Such compounds may be prepared by starting from asymmetric alkylenediamines, dialkylentriamines or trialkylenetetramines, such as but not limited to dimethylamino ethylamine, diethylamino ethylamine, dipropylamino ethylamine, dimethylamino propylamine, dimethylamino butylamine, trimethyl diethylenetriamine, and the like.

In a fifth preferred embodiment a compound of formula Ib

are used, wherein $R^{11}$ is selected from Z; and $R^{12}$ is selected from $R^{11}$ or $R^{40}$. Such compounds may be prepared by starting from cyclic amines, such as but not limited to piperazin, methylpiperazin, ethylpiperazin, propylpiperazin, butylpiperazin, and the like.

In a sixth preferred embodiment a compound of formula Ic (n=2)

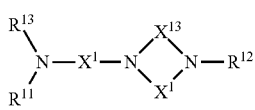

or Id (n=3)

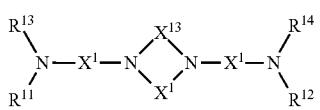

is used, wherein $R^{11}$ is selected from Z, $R^{12}$; $R^{13}$ and $R^{14}$ are selected from $R^{11}$ or $R^{40}$, preferably $R^{11}$. Such compounds may be prepared by starting from aminoalkylated cyclic amines, such as but not limited to bisaminoethyl piperazin, bisaminopropyl piperazin, bisaminobutyl piperazin, and the like.

In a seventh preferred embodiment a compound of formula I is used in which n is 0 and $R^{11}$, $R^{12}$ and $R^{13}$ are independently selected from Z. Preferably $X^4$ is selected from a $C_1$ to $C_6$ alkanediyl, more preferably a $C_1$ to $C_4$ alkanediyl, most preferably methanediyl, ethanediyl and propanediyl. Such compounds may be prepared by starting from a trialkanolamine, such as but not limited to trimethanolamine, triethanolamine, tripropanolamine, and the like.

In an eighth preferred embodiment a compound of formula II is used in which m is 0, 1, 2 or 3 and $R^{21}$, $R^{22}$, $R^{23}$, $R^{24}$ and $R^{25}$ are independently selected from $X^4$—O—Z. Preferably $X^4$ is selected from a $C_1$ to $C_4$ alkanediyl, more preferably methanediyl, ethanediyl or propanediyl, most preferably methanediyl. For m=1, 2 or 3, preferably $X^2$ is selected from $(CH_2)_p$—O—$(CH_2)_r$, with p and r being independently selected from 1, 2 or three, preferably 1 or 2. Most preferably p is the same as r. Such compounds may be prepared by starting from a pentaerythritol (m=0), bispentaerythritol (m=1) or trispentaerythritol (m=2), and the like.

In a ninth preferred embodiment a compound of formula II is used in which m is 0, 1 or 2, preferably 1; $X^2$ is a chemical bond or a $C_1$ to $C_4$ alkanediyl, preferably a chemical bond or methanediyl, most preferably a chemical bond; $R^{21}$, $R^{22}$, and $R^{31}$ or $R^{32}$ or both $R^{31}$ and $R^{32}$ are a further branching group to form a multiple branching group $(Z^p)_p$ $(R^{31}R^{32})_{2p}$. Such compounds may be prepared by starting from a polyhydric alcohol, such as but not limited to glycol or glycerol, which is reacted with an access of the branching agent and then reacted this with the alkylene oxide(s) to form the final suppressing agent. The molar ratio between the polyhydric alcohol and the branching agent is preferably 1:2 to 1:20, most preferably from 1:5 to 1:15.

In a tenth preferred embodiment, compounds of formula I are used, in which n is 1, 2, or 3; $R^{11}$, $R^{12}$, $R^{13}$, and $R^{14}$ are $X^5$—Z. Preferably $X^5$ and Z are independently selected from a copolymer of ethylene oxide with propylene oxide, butylene oxide, or a combination thereof. Preferably $X^5$ and Z have a degree of alkoxylation of from 2 to 100, more preferably of from 4 to 70. Preferably the overall degree of alkoxylation of $X^5$ and Z is of from 4 to 200, more preferably of from 10 to 140. Such compounds may be prepared by first reacting the polyamine starter with a first portion of at least one $C_2$ to $C_4$ alkylene oxide to form the first oxyalkylene group $X^5$. In a second step the product is reacted with a branching agent, followed by a further reaction with a second portion of at least one $C_2$ to $C_4$ alkylene oxide to form the second and third oxyalkylene groups $R^{31}$ and $R^{32}$. The first portion and the second portion of at least one $C_2$ to $C_4$ alkylene oxide may have the same or a different composition. Preferably $R^{31}$, $R^{32}$ and $X^5$ are prepared from ethylene oxide, propylene oxide or a combination thereof. In one alternative the first portion is prepared from ethylene oxide and the second portion is prepared from propylene oxide. In another alternative the first portion is prepared from propylene oxide and the second portion is prepared from ethylene oxide. In yet another alternative the first portion is prepared from a combination of ethylene oxide and propylene oxide and the second portion is prepared from a combination of ethylene oxide and propylene oxide. Such compounds may be prepared by starting from any polyamine starters described above.

In an eleventh preferred embodiment, compounds of formula II are used, in which m is 1, 2, or 3; $R^{21}$, $R^{22}$, $R^{23}$, $R^{24}$, $R^{25}$, and $R^{26}$ are $X^5$—Z. Preferably $X^5$ and Z are independently selected from a copolymer of ethylene oxide with propylene oxide, butylene oxide, or a combination thereof. Preferably $X^5$ and Z have a degree of alkoxylation of from 2 to 100, more preferably of from 4 to 70. Preferably the overall degree of alkoxylation of $X^5$ and Z is of from 4 to 200, more preferably of from 10 to 140. Such compounds may be prepared by first reacting the polyhydric alcohol starter with a first portion of at least one $C_2$ to $C_4$ alkylene oxide to form the first oxyalkylene group $X^5$. In a second step the product is reacted with a branching agent, followed by a further reaction with a second portion of at least one $C_2$ to $C_4$ alkylene oxide to form the second and third oxyalkylene groups $R^{31}$ and $R^{32}$. The first portion and the second portion of the at least one $C_2$ to $C_4$ alkylene oxide may have the same or a different composition. Preferably $R^{31}$, $R^{32}$ and $X^5$ are prepared from ethylene oxide, propylene oxide or a combination thereof. In one alternative the first portion is prepared from ethylene oxide and the second portion is prepared from propylene oxide. In another alternative the first portion is prepared from propylene oxide and the second portion is prepared from ethylene oxide. In yet another alternative the first portion is prepared from a combination of ethylene oxide and propylene oxide and the second portion is prepared from a combination of ethylene oxide and propylene oxide. Any other combination of one or more alkylene oxides in the first and second portion may advantageously be used. Such compounds may be prepared by starting from any polyhydric alcohol starters described above.

Further useful polyamine starters are described in unpublished European patent application No. 16194900.3, which is incorporated herein by reference.

Plating Bath

A wide variety of metal plating baths may be used with the present invention. Metal electroplating baths typically contain a metal ion source, an electrolyte, and the suppressing agent.

The plating baths are typically aqueous. The term "aqueous" means that the plating bath is water based. The water may be present in a wide range of amounts. Any type of water may be used, such as distilled, deionized or tap.

Preferably the plating bath is a solution of the compounds described herein in water. Preferably the water is electronic grade deionized water.

The metal ion source may be any compound capable of releasing metal ions to be deposited in the electroplating bath in sufficient amount, i.e. is at least partially soluble in the electroplating bath. Suitable metal ions include, but are not limited to, tin, silver (optionally in combination with tin), copper, and cobalt. In a preferred embodiment, the metal comprises or consist of copper or cobalt. A particularly preferred metal comprises or consists of copper. In other preferred embodiment the metal comprises copper and comprise tin in amount of below 0.1 g/l, preferably below 0.01 g/l, most preferably no tin.

It is preferred that the metal ion source is soluble in the plating bath to release 100% of the metal ions. Suitable metal ion sources are metal salts and include, but are not limited to, metal sulfates, metal halides, metal acetates, metal nitrates, metal fluoroborates, metal alkylsulfonates, metal arylsulfonates, metal sulfamates, metal gluconates and the like. It is preferred that the metal is copper. It is further preferred that the source of copper ions is copper sulfate, copper chloride, copper acetate, copper citrate, copper nitrate, copper fluoroborate, copper methane sulfonate, copper phenyl sulfonate and copper p-toluene sulfonate. Copper sulfate pentahydrate and copper methane sulfonate are particularly preferred. Such metal salts are generally commercially available and may be used without further purification.

Besides metal electroplating the compositions may be used in electroless deposition of metal containing layers. The compositions may particularly used in the deposition of barrier layers containing Ni, Co, Mo, W and/or Re. In this case, besides metal ions, further elements of groups III and V, particularly B and P may be present in the composition for electroless deposition and thus co-deposited with the metals.

The metal ion source may be used in the present invention in any amount that provides sufficient metal ions for electroplating on a substrate.

If the metal is copper, it is typically present in an amount in the range of from about 1 to about 300 g/l of the plating solution. Generally the suppressor is useful in low copper, medium copper and high copper baths. Low copper means a copper concentration from about 1 to about 20 g/l.

If the metal is tin, the tin salt is typically present in an amount in the range of from about 1 to about 300 g/l of plating solution. In a preferred embodiment the plating solution is free of lead, that is, they contain 1 wt % lead, more preferably below 0.5 wt %, and yet more preferably below 0.2 wt %, and still more preferably are free of lead. In another preferred embodiment the plating solution is essentially free of copper, that is, they contain 1 wt % copper, more preferably below 0.1 wt %, and yet more preferably below 0.01 wt %, and still more preferably are free of copper. Optionally, the tin plating baths may contain one or more alloying metal ions. Suitable alloying metals include, without limitation, silver, gold, copper, bismuth, indium, zinc, antimony, manganese and mixtures thereof. Preferred alloying metals are silver, copper, bismuth, indium, and mixtures thereof, and most preferably silver.

Also mixtures of metal salts may be electroplated according to the present invention. Thus, alloys, such as copper-tin having up to about 2 percent by weight tin, may be advantageously plated according to the present invention. The amounts of each of the metal salts in such mixtures depend upon the particular alloy to be plated and is well known to those skilled in the art.

In general, besides the metal ions and at least one of the suppressing agents according to the present invention the present metal electroplating compositions preferably include electrolyte, i.e. acidic or alkaline electrolyte, one or more sources of metal ions, optionally halide ions, and optionally other additives like accelerators and/or levelers.

The electroplating baths of the present invention may be prepared by combining the components in any order. It is preferred that the inorganic components such as metal salts, water, electrolyte and optional halide ion source, are first added to the bath vessel followed by the organic components such as leveling agents, accelerators, suppressors, surfactants and the like.

Typically, the plating baths of the present invention may be used at any temperature from 10 to 65 degrees C. or higher. It is preferred that the temperature of the plating baths is from 10 to 35 degrees C. and more preferably from 15 degrees to 30 degrees C.

Suitable electrolytes include such as, but not limited to, sulfuric acid, acetic acid, fluoroboric acid, alkylsulfonic acids such as methanesulfonic acid, ethanesulfonic acid, propanesulfonic acid and trifluoromethane sulfonic acid, arylsulfonic acids such as phenyl sulfonic acid and toluenesulfonic acid, sulfamic acid, hydrochloric acid, phosphoric acid, tetraalkylammonium hydroxide, preferably tetramethylammonium hydroxide, sodium hydroxide, potassium hydroxide and the like. In a particular embodiment the electrolyte does not comprise pyrophosphoric acid. Acids are typically present in an amount in the range of from about 1 to about 300 g/l. The plating bath may be a high, a medium or a low acid bath. Low acid baths usually comprise one or more acids in a concentration below 15 g/l. The pH of the acidic plating bath is usually below 5, preferably below 4, even more preferably below 3, most preferably below 2. Alkaline electrolytes are typically present in an amount of about 0.1 to about 20 g/l or to yield a pH of 8 to 13 respectively, and more typically to yield a pH of 9 to 12.

Such electrolytes may optionally contain a source of halide ions, such as chloride ions as in metal chloride, preferably copper chloride, or hydrochloric acid. A wide range of halide ion concentrations may be used in the present invention such as from about 0 to about 500 ppm. Typically, the halide ion concentration is in the range of from about 10 to about 100 ppm based on the plating bath. It is preferred that the electrolyte is sulfuric acid or methanesulfonic acid, and preferably a mixture of sulfuric acid or methanesulfonic acid and a source of chloride ions. The acids and sources of halide ions useful in the present invention are generally commercially available and may be used without further purification.

In a particular embodiment the suppressors of this invention may be used in low copper electrolyte compositions typically containing about below 20 g/l copper ions, in combination with typically about 2-15 g/l acid like sulfuric acid and with halide ions typically in the range of about 10-400 ppm by weight, preferably with chloride ions.

Other additives, particularly for copper electroplating

The electroplating baths according to the present invention may include one or more optional additives. Such optional additives include, but are not limited to, accelerators, other suppressors, levelers surfactants and the like.

Any accelerators may be advantageously used in the plating baths according to the present invention. Accelerators useful in the present invention include, but are not limited to, compounds comprising one or more sulphur atom and a sulfonic/phosphonic acid or their salts. Preferably the composition further comprises at least one accelerating agent.

Preferred accelerators have the general structure $MO_3X—R^{21}—(S)_n—R^{22}$, with:
M is a hydrogen or an alkali metal (preferably Na or K)
X is P or S
n=1 to 6
$R^{21}$ is selected from $C_1$-$C_8$ alkyl group or heteroalkyl group, an aryl group or a heteroaromatic group. Heteroalkyl groups will have one or more heteroatom (N, S, O) and 1-12 carbons. Carbocyclic aryl groups are typical aryl groups, such as phenyl, naphtyl. Heteroaromatic groups are also suitable aryl groups and contain one or more N, O or S atom and 1-3 separate or fused rings.
$R^{22}$ is selected from H or ($—S—R^{21'}XO_3M$), with $R^{21'}$ being identical or different from $R^{21}$.

More specifically, useful accelerators include those of the following formulae:

$$MO_3S—R^{21}—SH$$

$$MO_3S—R^{21}—S—S—R^{21'}—SO_3M$$

$$MO_3S—Ar—S—S—Ar—SO_3M$$

with $R^{21}$ is as defined above and Ar is Aryl.
Particularly preferred accelerating agents are:
SPS: bis-(3-sulfopropyl)-disulfide disodium salt
MPS: 3-mercapto-1-propansulfonic acid, sodium salt
Other examples of accelerators, used alone or in mixture, include, but are not limited to: MES (2-Mercaptoethanesulfonic acid, sodium salt); DPS (N,N-dimethyldithiocarbamic acid (3-sulfopropylester), sodium salt); UPS (3-[(amino-iminomethyl)-thio]-1-propylsulfonic acid); ZPS (3-(2-benzthiazolylthio)-1-propanesulfonic acid, sodium salt); 3-mercapto-propylsulfonicacid-(3-sulfopropyl)ester;
methyl-($\overline{\omega}$-sulphopropyl)-disulfide, disodium salt; methyl-($\overline{\omega}$-sulphopropyl)-trisulfide, disodium salt.

Such accelerators are typically used in an amount of about 0.1 ppm to about 3000 ppm, based on the total weight of the plating bath. Particularly suitable amounts of accelerator useful in the present invention are 1 to 500 ppm, and more particularly 2 to 100 ppm.

Any additional suppressor may be advantageously used in the present invention. Suppressors useful in the present invention include, but are not limited to, polymeric materials, particularly those having heteroatom substitution, and more particularly oxygen substitution. It is preferred that the suppressor is a polyalkyleneoxide. Suitable suppressors include polyethylene glycol copolymers, particularly polyethylene glycol polypropylene glycol copolymers. The arrangement of ethylene oxide and propylene oxide of suitable suppressors may be block, alternating, gradient, or random. The polyalkylene glycol may comprise further alkylene oxide building blocks such as butylene oxide. Preferably, the average molecular weight of suitable suppressors exceeds about 2000 g/mol. The starting molecules of suitable polyalkylene glycol may be alkyl alcohols such as methanol, ethanol, propanol, n-butanol and the like, aryl alcohols such as phenols and bisphenols, alkaryl alcohols such as benzyl alcohol, polyol starters such as glycol, glycerin, trimethylol propane, pentaerythritol, sorbitol, carbohydrates such as saccharose, and the like, amines and oligoamines such as alkyl amines, aryl amines such as aniline, triethanol amine, ethylene diamine, and the like, amides, lactams, heterocyclic amines such as imidazol and carboxylic acids. Optionally, polyalkylene glycol suppressors may be functionalized by ionic groups such as sulfate, sulfonate, ammonium, and the like.

If further suppressors are used, they are typically present in an amount in the range of from about 1 to about 10,000 ppm based on the weight of the bath, and preferably from about 5 to about 10,000 ppm.

Leveling agents can advantageously be used in the metal plating baths according to the present invention. The terms "leveling agent" and "leveler" are used herein synonymously. Preferably the composition further comprises at least one leveling agent.

Suitable leveling agents include, but are not limited to, one or more of polyethylene imine and derivatives thereof, quaternized polyethylene imine, polyglycine, poly(allylamine), polyaniline, polyurea, polyacrylamide, poly(melamine-co-formaldehyde), reaction products of amines with epichlorohydrin, reaction products of an amine, epichlorohydrin, and polyalkylene oxide, reaction products of an amine with a polyepoxide, polyvinylpyridine, polyvinylimidazole as described e.g. in WO11151785 A1, polyvinylpyrrolidone, polyaminoamides as described e.g. in WO11064154A2 and WO14072885 A2, or copolymers thereof, nigrosines, pentamethyl-para-rosaniline hydrohalide, hexamethyl-pararosaniline hydrohalide, di- or trialkanolamines and their derivatives as described in WO 2010/069810, and biguanides as described in WO12085811 A1.

Furthermore a compound containing a functional group of the formula N—R—S may be used as a leveling agents, where R is a substituted alkyl, unsubstituted alkyl, substituted aryl or unsubstituted aryl. Typically, the alkyl groups are ($C_1$-$C_6$)alkyl and preferably ($C_1$-$C_4$)alkyl. In general, the aryl groups include ($C_6$-$C_{20}$)aryl, preferably ($C_6$-$C_{10}$)aryl. Such aryl groups may further include heteroatoms, such as sulfur, nitrogen and oxygen. It is preferred that the aryl group is phenyl or napthyl. The compounds containing a functional group of the formula N—R—S are generally known, are generally commercially available and may be used without further purification. In such compounds containing the N—R—S functional group, the sulfur ("S") and/or the nitrogen ("N") may be attached to such compounds with single or double bonds. When the sulfur is attached to such compounds with a single bond, the sulfur will have another substituent group, such as but not limited to hydrogen, ($C_1$-$C_{12}$)alkyl, ($C_2$-$C_{12}$)alkenyl, ($C_6$-$C_{20}$)aryl, ($C_1$-$C_{12}$)alkylthio, ($C_2$-$C_{12}$)alkenylthio, ($C_6$-$C_{20}$)arylthio and the like. Likewise, the nitrogen will have one or more substituent groups, such as but not limited to hydrogen, ($C_1$-$C_{12}$)alkyl, ($C_2$-$C_{12}$)alkenyl, ($C_7$-$C_{10}$)aryl, and the like. The N—R—S functional group may be acyclic or cyclic. Compounds containing cyclic N—R—S functional groups include those having either the nitrogen or the sulfur or both the nitrogen and the sulfur within the ring system.

In general, the total amount of leveling agents in the electroplating bath is from 0.5 ppm to 10000 ppm based on the total weight of the plating bath. The leveling agents according to the present invention are typically used in a total amount of from about 0.1 ppm to about 1000 ppm based on the total weight of the plating bath and more typically from 1 to 100 ppm, although greater or lesser amounts may be used.

A large variety of further additives may typically be used in the bath to provide desired surface finishes for the Cu plated metal. Usually more than one additive is used with each additive forming a desired function. Advantageously, the electroplating baths may contain one or more of accelerators, levelers, sources of halide ions, grain refiners and mixtures thereof. Most preferably the electroplating bath contains both, an accelerator and a leveler in addition to the suppressor according to the present invention. Other additives may also be suitably used in the present electroplating baths.

Other additives, particularly for tin or tin alloy electroplating

Tin or tin alloy electroplating baths may further contain grain refiners. Grain refiners may be chosen from a compound of formula G1 or G2

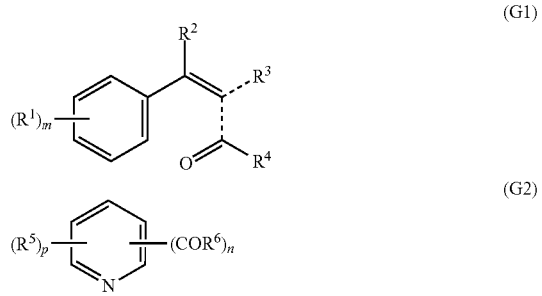

wherein each $R^1$ is independently $C_1$ to $C_6$ alkyl, $C_1$ to $C_6$ alkoxy, hydroxy, or halogen; $R^2$ and $R^3$ are independently selected from H and $C_1$ to $C_6$ alkyl; $R^4$ is H, OH, $C_1$ to $C_6$ alkyl or $C_1$ to $C_6$ alkoxy; m is an integer from 0 to 2; each $R^5$ is independently $C_1$ to $C_6$ alkyl; each $R^6$ is independently chosen from H, OH, $C_1$ to $C_6$ alkyl, or $C_1$ $C_6$ alkoxy; n is 1 or 2; and p is 0, 1 or 2.

Preferably, each $R^1$ is independently $C_1$ to $C_6$ alkyl, $C_1$ to $C_3$ alkoxy, or hydroxy, and more preferably $C_1$ to $C_4$ alkyl, $C_1$ to $C_2$ alkoxy, or hydroxy. It is preferred that $R^2$ and $R^3$ are independently chosen from H and $C_1$ to $C_3$ alkyl, and more preferably H and methyl. Preferably, $R^4$ is H, OH, $C^1$ to $C^4$ alkyl or $C_1$ to $C_4$ alkoxy, and more preferably H, OH, or $C_1$ to $C_4$ alkyl. It is preferred that $R^5$ is $C_1$ to $C_4$ alkyl, and more preferably $C_1$ to $C_3$ alkyl. Each $R^6$ is preferably chosen from H, OH, or $C_1$ to $C_6$ alkyl, more preferably H, OH, or $C_1$ to $C_3$ alkyl, and yet more preferably H or OH. It is preferred that m is 0 or 1, and more preferably m is 0. Preferably, n is 1. It is preferred that p is 0 or 1, and more preferably p is 0. A mixture of grain refiners may be used, such as two different grain refiners of formula 1, 2 different grain refiners of formula 2, or a mixture of a grain refiner of formula 1 and a grain refiner of formula 2.

Exemplary compounds useful as such grain refiners include, but are not limited to, cinnamic acid, cinnamaldehyde, benzylidene acetone, picolinic acid, pyridinedicarboxylic acid, pyridinecarboxaldehyde, pyridinedicarboxaldehyde, or mixtures thereof. Preferred grain refiners include benzalacetone, 4-methoxy benzaldehyde, benzylpyridin-3-carboxylate, and 1,10-phenantroline.

Further grain refiners may be chosen from an α,β-unsaturated aliphatic carbonyl compound. Suitable α,β-unsaturated aliphatic carbonyl compound include, but are not limited to, α,β-unsaturated carboxylic acids, α,β-unsaturated carboxylic acid esters, α,β-unsaturated amides, and α,β-unsaturated aldehydes. Preferably, such grain refiners are chosen from α,β-unsaturated carboxylic acids, α,β-unsaturated carboxylic acid esters, and α,β-unsaturated aldehydes, and more preferably α,β-unsaturated carboxylic acids, and α,β-unsaturated aldehydes. Exemplary α,β-unsaturated aliphatic carbonyl compounds include (meth) acrylic acid, crotonic acid, C to C6 alkyl (meth)acrylate, (meth)acrylamide, $C_1$ to $C_6$ alkyl crotonate, crotonamide, crotonaldehyde, (meth)acrolein, or mixtures thereof. Preferred α,β-unsaturated aliphatic carbonyl compounds are (meth)acrylic acid, crotonic acid, crotonaldehyde, (meth) acrylaldehyde or mixtures thereof.

In one embodiment, grain refiners may be present in the plating baths in an amount of 0.0001 to 0.045 g/l. Preferably, the grain refiners are present in an amount of 0.0001 to 0.04 g/l, more preferably in an amount of 0.0001 to 0.035 g/l, and yet more preferably from 0.0001 to 0.03 g/l. Compounds useful as grain refiners are generally commercially available from a variety of sources and may be used as is or may be further purified.

In another more preferred embodiment, the compositions for tin or tin alloy electroplating comprise a single grain refiner, more preferably a single grain refiner that is no α,β-unsaturated aliphatic carbonyl compound, most preferably essentially no grain refiner or no grain refiner at all. Surprisingly, it was found that particularly for filling recessed features having an aperture size below 50 μm there is no need to use any grain refiners but the suppressing agent leads to a good coplanarity without the use of any grain refiner.

The present compositions may optionally include further additives, such as antioxidants, organic solvents, complexing agents, and mixtures thereof.

Antioxidants may optionally be added to the present composition to assist in keeping the metal, particularly tin in a soluble, divalent state. It is preferred that one or more antioxidants are used in the present compositions. Exemplary antioxidants include, but are not limited to, hydroquinone, and hydroxylated and/or alkoxylated aromatic compounds, including sulfonic acid derivatives of such aromatic compounds, and preferably are: hydroquinone; methylhydroquinone; resorcinol; catechol; 1,2,3-trihydroxybenzene; 1,2-dihydroxybenzene-4-sulfonic acid; 1,2-dihydroxybenzene-3, 5-disulfonic acid; 1,4-dihydroxybenzene-2-sulfonic acid; 1,4-dihydroxybenzene-2, 5-disulfonic acid; 2,4-dihyroxybenzene sulfonic acid, and p-Methoxyphenol. Such antioxidants are disclosed in U.S. Pat. No. 4,871,429. Other suitable antioxidants or reducing agents include, but are not limited to, vanadium compounds, such as vanadylacetylacetonate, vanadium triacetylacetonate, vanadium halides, vanadium oxyhalides, vanadium alkoxides and vanadyl alkoxides. The concentration of such reducing agent is well known to those skilled in the art, but is typically in the range of from 0.1 to 10 g/l, and preferably from 1 to 5 g/l. Such antioxidants are generally commercially available from a variety of sources.

A tin or tin alloy electroplating bath may further contain complexing agents for complexing tin and/or any other metal present in the composition. A typical complexing agent is 3,6-dithia-1,8-octanediol. Typical complexing agents are polyoxy monocarboxylic acids, polycarboxylic acids, aminocarboxylic acids, lactone compounds, and salts thereof. Other complexing agents are organic thiocompounds like thiourea, thiols or thioethers as disclosed in U.S. Pat. No. 7,628,903, JP 4296358 B2, EP 0854206 A and U.S. Pat. No. 8,980,077 B2.

Process

According to one embodiment of the present invention a metal plating bath comprising a composition as described above is used for depositing the metal on substrates comprising features having an aperture size of 30 nanometers or less.

A further embodiment of the present invention is a process for depositing a metal layer on a substrate by
  a) contacting a metal plating bath comprising a composition according to the present invention with the substrate, and
  b) applying a current to the substrate for a time sufficient to deposit a metal layer onto the substrate.

The present invention is useful for depositing a metal layer, particularly a copper layer, on a variety of substrates, particularly those having submicron and variously sized apertures. For example, the present invention is particularly suitable for depositing copper on integrated circuit substrates, such as semiconductor devices, with small diameter vias, trenches or other apertures. In one embodiment, semiconductor devices are plated according to the present invention. Such semiconductor devices include, but are not limited to, wafers used in the manufacture of integrated circuits.

Preferably the substrate comprises submicrometer sized features and the deposition is performed to fill the submicrometer sized features. Most preferably the submicrometer-sized features have an (effective) aperture size from 1 to 30 nanometers and/or an aspect ratio of 4 or more. More preferably the features have an aperture size of 25 nanometers or below, most preferably of 20 nanometers or below.

The aperture size according to the present invention means the smallest diameter or free distance of a feature before plating, i.e. after copper seed deposition. The terms "aperture" and "opening" are used herein synonymously. A convex shape is a feature having an aperture size being at least 25%, preferably 30%, most preferably 50% smaller than the biggest diameter or free distance of the feature before plating.

The agents/additives according to the present invention can further advantageously be used for electroplating of copper in through silicon vias (TSV). Such vias normally have diameters of several micrometers up to 100 micrometers and large aspect ratios of at least 4, sometimes above 10.

Furthermore the agents/additives according to the present invention can advantageously be used in bonding technologies such as the manufacture of copper pillars or tin or tin/silver solder bumps of typically 50 to 100 micrometers height and diameter for the bumping process, in circuit board technologies like the manufacture of high-density-interconnects on printed circuit boards using microvia plating or plated-through-hole technologies, or in other packaging processes for electronic circuits.

Typically, substrates are electroplated by contacting the substrate with the plating baths of the present invention. The substrate typically functions as the cathode. The plating bath contains an anode, which may be soluble or insoluble. Optionally, cathode and anode may be separated by a membrane. Potential is typically applied to the cathode. Sufficient current density is applied and plating performed for a period of time sufficient to deposit a metal layer, such as a copper layer, having a desired thickness on the substrate. Suitable current densities include, but are not limited to, the range of 1 to 250 mA/cm$^2$. Typically, the current density is in the range of 1 to 60 mA/cm$^2$ when used to deposit copper in the manufacture of integrated circuits. The specific current density depends on the substrate to be plated, the leveling agent selected and the like. Such current density choice is within the abilities of those skilled in the art. The applied current may be a direct current (DC), a pulse current (PC), a pulse reverse current (PRC) or other suitable current.

In general, when the present invention is used to deposit metal on a substrate such as a wafer used in the manufacture of an integrated circuit, the plating baths are agitated during use. Any suitable agitation method may be used with the present invention and such methods are well-known in the art. Suitable agitation methods include, but are not limited to, inert gas or air sparging, work piece agitation, impingement and the like. Such methods are known to those skilled in the art. When the present invention is used to plate an integrated circuit substrate, such as a wafer, the wafer may be rotated such as from 1 to 150 RPM and the plating solution contacts the rotating wafer, such as by pumping or spraying. In the alternative, the wafer need not be rotated where the flow of the plating bath is sufficient to provide the desired metal deposit.

The metal, particularly copper, tin and cobalt, is deposited in apertures according to the present invention without substantially forming voids within the metal deposit. By the term "without substantially forming voids", it is meant that 95% of the plated apertures are void-free. It is preferred that 98% of the plated apertures are void-free, mostly preferred is that all plated apertures are void-free.

While the process of the present invention has been generally described with reference to semiconductor manufacture, it will be appreciated that the present invention may be useful in any electrolytic process where metal filled small features that are substantially free of voids are desired. Such processes include printed wiring board manufacture. For example, the present plating baths may be useful for the plating of vias, pads or traces on a printed wiring board, as well as for bump plating on wafers. Other suitable processes include packaging and interconnect manufacture. Accordingly, suitable substrates include lead frames, interconnects, printed wiring boards, and the like.

Plating equipment for plating semiconductor substrates are well known. Plating equipment comprises an electroplating tank which holds Cu electrolyte and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings such as trenches and vias. The wafer substrate is typically coated with a seed layer of Cu or other metal or a metal containing layer to initiate plating thereon. A Cu seed layer may be applied by chemical vapor deposition (CVD), physical vapor deposition (PVD), atomic layer deposition (ALD) or the like. An anode is also preferably circular for wafer plating and is horizontally disposed at the lower part of tank forming a space between the anode and cathode. The anode is typically a soluble anode.

These bath additives are useful in combination with membrane technology being developed by various tool manufacturers. In this system, the anode may be isolated from the organic bath additives by a membrane. The purpose of the separation of the anode and the organic bath additives is to minimize the oxidation of the organic bath additives.

The cathode substrate and anode are electrically connected by wiring and, respectively, to a rectifier (power supply). The cathode substrate for direct or pulse current has a net negative charge so that Cu ions in the solution are reduced at the cathode substrate forming plated Cu metal on the cathode surface. An oxidation reaction takes place at the anode. The cathode and anode may be horizontally or vertically disposed in the tank.

Metal, particularly copper, is deposited in apertures according to the present invention without substantially forming voids within the metal deposit. By the term "without substantially forming voids", it is meant that 95% of the plated apertures are void-free. It is preferred that the plated apertures are void-free.

Preferably the substrate comprises nanometer sized features and the deposition is performed to fill the micrometer or nanometer sized features, particularly those having an aperture size from 1 to 30 nm and/or an aspect ratio of 4 or more. The suppressors are even capable of void-free filling features having aperture sizes of 15 nm, particularly 10 nm or below and aspect ratios of 4 or more.

In general, when preparing tin or tin alloy bumps, a photoresist layer is applied to a semiconductor wafer, followed by standard photolithographic exposure and development techniques to form a patterned photoresist layer (or plating mask) having openings or vias therein. The dimensions of the plating mask (thickness of the plating mask and the size of the openings in the pattern) defines the size and location of the tin or tin alloy layer deposited over the I/O pad and UBM. The diameter of such deposits typically range from 1 to 300 µm, preferably in the range from 2 to 100 µm.

While the process of the present invention has been generally described with reference to semiconductor manufacture, it will be appreciated that the present invention may be useful in any electrolytic process where a substantially void-free copper deposit is desired. Accordingly, suitable substrates include lead frames, interconnects, printed wiring boards, and the like.

All percent, ppm or comparable values refer to the weight with respect to the total weight of the respective composition except where otherwise indicated. All cited documents are incorporated herein by reference.

The following examples shall further illustrate the present invention without restricting the scope of this invention.

Analytical Methods

The molecular weight of the suppressing agents was determined by size-exclusion chromatography (SEC). Polystyrene was used as standard and tetrahydrofuran as eluent. The temperature of the column was 30° C., the injected volume 30 µL (µliter) and the flow rate 1.0 ml/min. The weight average molecular weight ($M_w$), the number average molecular weight ($M_n$) and the polydispersity PDI ($M_w/M_n$) of the suppressors were determined.

The amine number was determined according to DIN 53176 by titration of a solution of the polymer in acetic acid with perchloric acid.

Coplanarity and morphology (roughness) was determined by measuring the height of the substrate by laser scanning microscopy.

The patterned photoresist contained vias of 8 µm diameter and 15 µm depth and pre-formed copper µ-bump of 5 µm height. The isolated (iso)-area consists of a 3×6 array of pillars with a center to center distance (pitch) of 32 µm. The dense area consists of an 8×16 array of pillars with a center to center distance (pitch) of 16 µm. For the calculation of the within die coplanarity 3 bumps of the iso-area and 3 bumps from the center of the dense area are taken.

The Within Die (WID) coplanarity (COP) was determined by using formula $$COP = (H_{iso} - H_{dense})/H_{Av}$$

Herein $H_{iso}$ and $H_{dense}$ are the average heights of the bumps in the iso/dense area and $H_{Av}$ is the overall average height of all bumps in the iso and dense area as described above.

The Average Roughness $R_a$ was calculated by using formula $$R_a = \frac{1}{n}\sum_{i=1}^{n}|H_i - H_{mean}|$$

Herein $H_i$ is the height of location i on a certain bump. During a laser scan of the surface of one bump the height of n locations is determined. $H_{mean}$ is the average height of all n locations of one bump.

EXAMPLES

Several suppressors have been synthesized by polyalkoxylation of the respective amine or alcohol starters.

Example A: Synthesis of Suppressors

Example A1: Synthesis of Suppressor 1

Glycerine (30 g) and potassium tert-butoxide (5.5 g) were placed into a 500 mL four-necked flask under nitrogen atmosphere and heated up to 160° C. Then glycerine carbonate (346.2 g) was added over a period of 45 min. The mixture was allowed to post react for 5 h. A dark brown viscous intermediate product (246.9 g) was obtained. Subsequently the intermediate product (87.5 g) and potassium tert-butoxide (0.6 g) were placed into a 3.5 l autoclave. After nitrogen neutralization the pressure was adjusted to 1.0 bar and the mixture was homogenized at 130° C. for 1 h. Then propylene oxide (576.2 g) and ethylene oxide (247.2 g) were added at 130° C. over a period of 4 h, reaching a maximum pressure of 7 bar. To complete the reaction, the mixture was allowed to post-react for 15 h at 130° C. at a pressure of 7 bar. Then, the temperature was decreased to 80° C. and volatile compounds were removed in vacuum at 80° C.

Suppressor 1 was obtained as a clear, brown oil (914.5 g).

Example A2: Synthesis of Suppressor 2

Trispentaerythritol (60 g) dissolved in Xylol and potassium tert-butoxide (0.6 g) were placed into a 3.5 l autoclave. After nitrogen neutralization the pressure was adjusted to 1.0 bar and the mixture was homogenized at 130° C. for 1 h. Then propylene oxide (403.5 g) and ethylene oxide (173.2 g) were added at 130° C. over a period of 4 h, reaching a maximum pressure of 7 bar. To complete the reaction, the mixture was allowed to post-react for 15 h at 130° C. at a pressure of 7 bar. Then, the temperature was decreased to 80° C. and volatile compounds were removed in vacuum at 80° C. A viscous yellowish product A (633.3 g) was obtained.

The intermediate product A (300 g) and potassium tert-butoxide (0.6 g) were placed into a 1000 mL four-necked flask under nitrogen atmosphere and heated up to 160° C. Then glycerine carbonate (71.7 g) was added over a period of 30 min. The mixture was allowed to post react for 20 h. A beige-coloured intermediate product B (342.2 g) was obtained.

Afterwards the intermediate product B (305.5 g) and potassium tert-butoxide (0.8 g) were placed into a 3.5 l autoclave. After nitrogen neutralization the pressure was adjusted to 1.0 bar and the mixture was homogenized at 130° C. for 1 h. Then propylene oxide (177.7 g) and ethylene oxide (75.7 g) were added at 130° C. over a period of 4 h, reaching a maximum pressure of 7 bar. To complete the reaction, the mixture was allowed to post-react for 4 h at 130° C. at a pressure of 7 bar. Then, the temperature was decreased to 80° C. and volatile compounds were removed in vacuum at 80° C.

Suppressor 2 was obtained as a clear, brown oil (549.7 g).

Example A3: Synthesis of Suppressor 3

Diethylene triamine (202.8 g) dissolved in water (10 g) was placed into a 3.5 l autoclave. After nitrogen neutralization the pressure was adjusted to 1.0 bar and the mixture was homogenized at 130° C. for 1 h. Then ethylene oxide (432.8 g) was added at 90° C. over a period of 5 h, reaching a maximum pressure of 5 bar. To complete the reaction, the mixture was allowed to post-react for 10 h at 130° C. at a pressure of 5 bar. Then, the temperature was decreased to and volatile compounds were removed in vacuum at 100° C. A yellow viscous intermediated product A was obtained (631 g).

Subsequently the intermediate product A (60 g) and potassium hydroxide (0.9 g) were placed into a 3.5 l autoclave. After nitrogen neutralization the pressure was adjusted to 1.0 bar and the mixture was homogenized at 130° C. for 1 h. Then propylene oxide (592.7 g) and ethylene oxide (408.6 g) were added at 130° C. over a period of 4 h, reaching a maximum pressure of 7 bar. To complete the reaction, the mixture was allowed to post-react for 10 h at 130° C. at a pressure of 7 bar. Then, the temperature was decreased to 80° C. and volatile compounds were removed in vacuum at 80° C.

A slightly viscous intermediate product B was obtained (1024.1 g).

The intermediate product B (150 g) and potassium tert-butoxide (0.1 g) were placed into a 250 mL four-necked flask under nitrogen atmosphere and heated up to 160° C. Then glycerine carbonate (15.5 g) was added over a period of 10 min. The mixture was allowed to post react for 20 h. A beige-coloured intermediate product C (157.3 g) was obtained.

Subsequently the intermediate product C (115.2 g) and potassium tert-butoxide (0.05 g) were placed into a 3.5 l autoclave. After nitrogen neutralization the pressure was adjusted to 1.0 bar and the mixture was homogenized at 130° C. for 1 h. Then propylene oxide (73.2 g) and ethylene oxide (55.4 g) were added at 130° C. over a period of 4 h, reaching a maximum pressure of 7 bar. To complete the reaction, the mixture was allowed to post-react for 4 h at 130° C. at a pressure of 7 bar. Then, the temperature was decreased to 80° C. and volatile compounds were removed in vacuum at 80° C. After filtration suppressor 3 was obtained as a brown liquid (239.8 g).

Example A4: Synthesis of Suppressor 4

Diethylene triamine (50 g) dissolved in water (52.3 g) was placed into a 1 L four-necked flask under nitrogen atmosphere and heated up to 120° C. Then glycidol (186.9 g) was added over a period of 1.5 h. The mixture was allowed to post react for 4 h at 120° C. A brown viscous intermediate product (222.8 g) was obtained.

The intermediate product (53 g) and potassium hydroxide (0.8 g) were placed into a 3.5 l autoclave. After nitrogen neutralization the pressure was adjusted to 1.0 bar and the mixture was homogenized at 130° C. for 1 h. Then propylene oxide (780 g) and ethylene oxide (591.5 g) were added at 130° C. over a period of 5 h, reaching a maximum pressure of 7 bar. To complete the reaction, the mixture was allowed to post-react for 20 h at 130° C. at a pressure of 7 bar. Then, the temperature was decreased to 80° C. and volatile compounds were removed in vacuum at 80° C.

Suppressor 4 was obtained as brown product (1359.8 g).

Example A5: Synthesis of Suppressor 5

Ethylen diamine (40 g) dissolved in water (47.9 g) was placed into a 500 mL four-necked flask under nitrogen atmosphere and heated up to 100° C. Then glycidol (205.4 g) was added over a period of 2 h. The mixture was allowed to post react for 4 h at 100° C. A brown viscous intermediate product A (244 g) was obtained.

Subsequently the intermediate product B (59.6 g) and potassium tert-butoxide (1.1 g) were placed into a 3.5 l autoclave. After nitrogen neutralization the pressure was adjusted to 1.0 bar and the mixture was homogenized at 130° C. for 1 h. Then propylene oxide (761.4 g) and ethylene oxide (326.3 g) were added at 130° C. over a period of 4 h, reaching a maximum pressure of 7 bar. To complete the reaction, the mixture was allowed to post-react for 15 h at 130° C. at a constant pressure of 7 bar. Then, the temperature was decreased to 80° C. and volatile compounds were removed in vacuum at 80° C.

Suppressor 5 was obtained as a yellowish slightly viscous liquid (1140.2 g).

Example A6: Synthesis of Suppressor 6

Triethanol amine (100 g) and potassium tert-butoxide (3.8 g) were placed into a 500 mL four-necked flask under nitrogen atmosphere and heated up to 100° C. Then glycidol (248.3 g) was added over a period of 1 h. The mixture was allowed to post react for 4 h at 107° C. A viscous yellowish intermediate product (348.5 g) was obtained.

Subsequently the intermediate product (100 g) and potassium tert-butoxide (1.1 g) were placed into a 3.5 l autoclave. After nitrogen neutralization the pressure was adjusted to 1.0 bar and the mixture was homogenized at 130° C. for 1 h. Then propylene oxide (726.6 g) was added at 130° C. over a period of 10 h, reaching a maximum pressure of 7.2 bar. The mixture was allowed to post react for 14 h at a constant pressure of 2 bar. Afterwards ethylene oxide (551.1 g) was added at 130° C. over a period of 10 h, reaching a maximum pressure of 5 bar. To complete the reaction, the mixture was allowed to post-react for 6 h at 130° C. at a constant pressure of 3 bar. Then, the temperature was decreased to 80° C. and volatile compounds were removed in vacuum at 80° C.

Suppressor 6 was obtained as a yellowish viscous liquid (1370.4 g) having an amine number of 0.15 mmol/g.

Example A7: Synthesis of Suppressor 7

Piperazine (100 g) was placed into a 500 mL four-necked flask under nitrogen atmosphere and heated up to 110° C. Then glycidol (172 g) was added over a period of 1 h. The mixture was allowed to post react for 4 h at 120° C. A orange liquid (268.7 g) having an amine number of 8.34 mmol/g was obtained as pre-product.

The obtained pre-product (198 g) and potassium tert-butoxide (1.8 g) were placed into a 3.5 l autoclave. After nitrogen neutralization the pressure was adjusted to 1.5 bar and the mixture was homogenized at 130° C. for 1 h. Then propylene oxide (737 g) was added at 130° C. over a period of 10 h, reaching a maximum pressure of 7 bar. The mixture was allowed to post react for 6 h. Then, the temperature was decreased to 80° C. and volatile compounds were removed in vacuum at 80° C.

The intermediate product was obtained as an orange oil (941 g).

Subsequently the intermediate product (200 g) and potassium tert-butoxide (2.4 g) were placed into a 3.5 l autoclave. After nitrogen neutralization the pressure was adjusted to 1.5 bar and the mixture was homogenized at 130° C. for 1 h. Then propylene oxide (525.5 g) was added at 130° C. over a period of 10 h, reaching a maximum pressure of 7 bar. The mixture was allowed to post react for 6 h. Afterwards ethylene oxide (518.2 g) was added at 130° C. over a period of 8 h, reaching a maximum pressure of 5 bar. To complete the reaction, the mixture was allowed to post-react for 6 h at 130° C. at a constant pressure of 3 bar. Then, the temperature was decreased to 80° C. and volatile compounds were removed in vacuum at 80° C. Suppressor 7 was obtained yellowish oil (1252 g) having an amine number of 0.29 mmol/g.

Example A8: Synthesis of Suppressor 8

N-(2-aminoethyl) piperazine (85 g) was placed into a 500 mL four-necked flask under nitrogen atmosphere and heated up to 100° C. Then glycidol (125.7 g) was added over a period of 1 h. The mixture was allowed to post react for 4 h. A yellow intermediate product (203 g) having an amine number of 8.2 mmol/g was obtained.

The intermediate product (66.5 g) and potassium tert-butoxide (1.1 g) were placed into a 3.5 l autoclave. After nitrogen neutralization the pressure was adjusted to 1.0 bar and the mixture was homogenized at 130° C. for 1 h. Then propylene oxide (311.1 g) was added at 130° C. over a period of 6 h, reaching a maximum pressure of 7.5 bar. The mixture was allowed to post react for 6 h. Afterwards ethylene oxide (236 g) was added at 130° C. over a period of 3 h, reaching a maximum pressure of 5 bar. To complete the reaction, the mixture was allowed to post-react for 6 h at 130° C. Then, the temperature was decreased to 80° C. and volatile compounds were removed in vacuum at 80° C. Suppressor 8 was obtained as orange liquid (600 g) having an amine number of 0.88 mmol/g.

Example A9: Synthesis of Suppressor 9

N-(2-aminoethyl) piperazine (81.6 g) was placed into a 500 mL four-necked flask under nitrogen atmosphere and heated up to 100° C. Then glycidol (120.7 g) was added over a period of 1 h. The mixture was allowed to post react for 4 h. A yellow intermediate product (180 g) having an amine number of 7.85 mmol/g was obtained.

The intermediate product (111 g) and potassium tert-butoxide (1.2 g) were placed into a 3.5 l autoclave. After nitrogen neutralization the pressure was adjusted to 1.0 bar and the mixture was homogenized at 130° C. for 1 h. Then propylene oxide (469.9 g) was added at 130° C. over a period of 10 h, reaching a maximum pressure of 7.2 bar. The mixture was allowed to post react for 10 h. Afterwards ethylene oxide (201.8 g) was added at 130° C. over a period of 6 h, reaching a maximum pressure of 5 bar. To complete the reaction, the mixture was allowed to post-react for 6 h at 130° C. Then, the temperature was decreased to 80° C. and volatile compounds were removed in vacuum at 80° C.

Suppressor 9 was obtained as orange liquid (774.4 g) having an amine number of 1.16 mmol/g.

Example A10: Synthesis of Suppressor 10

Tris (2-aminoethyl) amine (30 g) was placed into a 250 mL four-necked flask under nitrogen atmosphere and heated up to 100° C. Then glycidol (91.2 g) was added over a period of 1 h 45 min. The mixture was allowed to post react for 6.5 h. A yellow intermediate product (119.8 g) having an amine number of 5.18 mmol/g was obtained.

The intermediate product (59.1 g) and potassium tert-butoxide (1.1 g) were placed into a 3.5 l autoclave. After nitrogen neutralization the pressure was adjusted to 1.0 bar and the mixture was homogenized at 130° C. for 1 h. Then propylene oxide (493 g) was added at 130° C. over a period of 6 h, reaching a maximum pressure of 7 bar. The mixture was allowed to post react for 12 h. Afterwards ethylene oxide (198 g) was added at 130° C. over a period of 6 h, reaching a maximum pressure of 4.4 bar. To complete the reaction, the mixture was allowed to post-react for 14 h at 130° C. Then, the temperature was decreased to 80° C. and volatile compounds were removed in vacuum at 80° C.

Suppressor 10 was obtained as a brownish product (750.3 g) having an amine number of 0.16 mmol/g.

Example A11: Synthesis of Suppressor 11

1-Methylpiperazine (126.4 g) was placed into a 500 mL four-necked flask under nitrogen atmosphere and heated up to 100° C. Then glycidol (93.5 g) was added over a period of 45 min. The mixture was allowed to post react for 3 h. A yellow solid intermediate product (193.4 g) having an amine number of 11.35 mmol/g was obtained.

The intermediate product (66.4 g) and potassium tert-butoxide (1.9 g) were placed into a 3.5 l autoclave. After nitrogen neutralization the pressure was adjusted to 2.0 bar and the mixture was homogenized at 130° C. for 1 h. Then propylene oxide (642 g) was added at 130° C. over a period of 10 h, reaching a maximum pressure of 5 bar. The mixture was allowed to post react for 10 h. Afterwards ethylene oxide (492 g) was added at 130° C. over a period of 8 h, reaching a maximum pressure of 5 bar. To complete the reaction, the mixture was allowed to post-react for 6 h at 130° C. Then, the temperature was decreased to 80° C. and volatile compounds were removed in vacuum at 80° C.

Suppressor 11 was obtained as a brown liquid (1221 g) having an amine number of 0.63 mmol/g.

Example A12: Synthesis of Suppressor 12

Methyl dipropylene triamine (50 g) was placed into a 500 mL four-necked flask under nitrogen atmosphere and heated up to 100° C. Then glycidol (102.2 g) was added over a period of 110 min. The mixture was allowed to post react for 10 h at 90° C. A solid intermediate product (144.7 g) having an amine number of 6.9 mmol/g was obtained.

The intermediate product (49 g) dissolved in Xylol and potassium tert-butoxide (1.7 g) were placed into a 3.5 l autoclave. After nitrogen neutralization the pressure was adjusted to 1.0 bar and the mixture was homogenized at 130° C. for 1 h. Then propylene oxide (418.9 g) was added at 130° C. over a period of 13 h, reaching a maximum pressure of 7 bar. The mixture was allowed to post react for 6 h. Afterwards ethylene oxide (317.8 g) was added at 130° C.

over a period of 11 h, reaching a maximum pressure of 6 bar. To complete the reaction, the mixture was allowed to post-react for 6 h at 130° C. Then, the temperature was decreased to 80° C. and volatile compounds were removed in vacuum at 80° C.

Suppressor 12 was obtained as a yellowish liquid (708 g) having an amine number of 0.44 mmol/g.

Example A13: Synthesis of Suppressor 13

N-(2-aminoethyl) piperazine (306 g) was placed into 2 l autoclave. After nitrogen neutralization the mixture was heated up to 80° C. Then glycidol (453.4 g) was added over a period of 5 h 15 min. The mixture was allowed to post react for 6 h. A viscous yellow intermediate product (738 g) having an amine number of 8.0 mmol/g was obtained.

The intermediate product (64.6 g) and potassium tert-butoxide (1.5 g) were placed into a 2 l autoclave. After nitrogen neutralization the pressure was adjusted to 1.0 bar and the mixture was homogenized at 130° C. for 1 h. Then propylene oxide (604 g) was added at 130° C. over a period of 10 h, reaching a maximum pressure of 7.5 bar. The mixture was allowed to post react for 10 h. Afterwards ethylene oxide (257.7 g) was added at 130° C. over a period of 6 h, reaching a maximum pressure of 4.5 bar. To complete the reaction, the mixture was allowed to post-react for 6 h at 130° C. Then, the temperature was decreased to 80° C. and volatile compounds were removed in vacuum at 80° C.

Suppressor 13 was obtained as a yellow liquid (927.4 g) having an amine number of 0.59 mmol/g.

Example A14: Synthesis of Suppressor 14

Tris(2-aminoethyl) amine (33 g) was placed into a 250 mL four-necked flask under nitrogen atmosphere and heated up to 100° C. Then glycidol (100.3 g) was added over a period of 2 h. The mixture was allowed to post react for 6 h. A viscous yellow intermediate product (130.2 g) having an amine number of 5.1 mmol/g was obtained.

The intermediate product (66.8 g) and potassium tert-butoxide (0.7 g) were placed into a 3.5 l autoclave. After nitrogen neutralization the pressure was adjusted to 1.0 bar and the mixture was homogenized at 130° C. for 1 h. Then propylene oxide (249.6 g) was added at 130° C. over a period of 7 h, reaching a maximum pressure of 7.5 bar. The mixture was allowed to post react for 10 h. Afterwards ethylene oxide (106.6 g) was added at 130° C. over a period of 3 h, reaching a maximum pressure of 5 bar. To complete the reaction, the mixture was allowed to post-react for 10 h at 130° C. Then, the temperature was decreased to 80° C. and volatile compounds were removed in vacuum at 80° C.

Suppressor 14 was obtained as a yellow liquid (413.2 g) having an amine number of 0.9 mmol/g.

Example A15: Synthesis of Suppressor 15

Diethylene triamine (100 g) dissolved in 150 ml Xylol was placed into a 2 l autoclave. After nitrogen neutralization the mixture was heated up to 110° C. Then glycidol (359 g) was added over a period of 7 h 15 min. The mixture was allowed to post react for 10 h. A yellow intermediate product (473.6 g) having an amine number of 6.3 mmol/g was obtained.

The intermediate product (94.7 g) and potassium tert-butoxide (0.9 g) were placed into a 3.5 l autoclave. After nitrogen neutralization the pressure was adjusted to 1.0 bar and the mixture was homogenized at 130° C. for 1 h. Then ethylene oxide (153.3 g) was added at 130° C. over a period of 6 h, reaching a maximum pressure of 7.5 bar. The mixture was allowed to post react for 6 h. Afterwards propylene oxide (357.8 g) was added at 130° C. over a period of 3 h, reaching a maximum pressure of 5 bar. To complete the reaction, the mixture was allowed to post-react for 6 h at 130° C. Then, the temperature was decreased to 80° C. and volatile compounds were removed in vacuum at 80° C.

Suppressor 15 was obtained as a yellowish product (413.2 g) having an amine number of 0.9 mmol/g.

Example A16: Synthesis of Suppressor 16

Piperazine (58.1 g) was placed into a 500 mL four-necked flask under nitrogen atmosphere and heated up to 115° C. Then glycidol (100 g) was added over a period of 110 min. The mixture was allowed to post react for 5 h at 120° C. A beige-coloured intermediate product (151 g) having an amine number of 8.3 mmol/g was obtained.

Subsequently the intermediate product (117 g) and potassium tert-butoxide (1.9 g) were placed into a 3.5 l autoclave. After nitrogen neutralization the pressure was adjusted to 1.0 bar and the mixture was homogenized at 130° C. for 1 h. Then propylene oxide (290 g) was added at 130° C. over a period of 6 h, reaching a maximum pressure of 5 bar. Afterwards ethylene oxide (220 g) was added at 130° C. over a period of 5 h, reaching a maximum pressure of 4 bar. To complete the reaction, the mixture was allowed to post-react for 8 h at 130° C. Then, the temperature was decreased to 80° C. and volatile compounds were removed in vacuum at 80° C.

Suppressor 16 was obtained as a dark brown liquid (618.6 g) having an amine number of 1.54 mmol/g.

Example A17: Synthesis of Suppressor 17

Ethylene diamine (97 g) was placed into 3.5 l autoclave. After nitrogen neutralization the mixture was heated up to 80° C. Then glycidol (478.3 g) was added over a period of 22 h. The mixture was allowed to post react for 8 h. A highly viscous, brown intermediate product (556.6 g) having an amine number of 5.26 mmol/g was obtained.

The intermediate product (123 g) and potassium tert-butoxide (1.5 g) were placed into a 3.5 l autoclave. After nitrogen neutralization the pressure was adjusted to 1.0 bar and the mixture was homogenized at 130° C. for 1 h. Then propylene oxide (741.6 g) was added at 130° C. over a period of 14 h, reaching a maximum pressure of 7 bar. The mixture was allowed to post react for 6 h. Then, the temperature was decreased to 80° C. and volatile compounds were removed in vacuum at 80° C.

Suppressor 17 was obtained as a dark brown liquid (859.3 g) having an amine number of 0.78 mmol/g.

Example A18: Synthesis of Suppressor 18

Glycerine (40 g) and potassium tert-butoxide (0.07 g) were placed into a 250 mL four-necked flask under nitrogen atmosphere and heated up to 100° C. Then glycidol (100 g) was added over a period of 2 h. The mixture was allowed to post react for 4 h. A yellow, highly viscous intermediate product (314.3 g) was obtained.

The intermediate product (94.3 g) and potassium tert-butoxide (1.1 g) were placed into a 3.5 l autoclave. After nitrogen neutralization the pressure was adjusted to 1.5 bar and the mixture was homogenized at 130° C. for 1 h. Then propylene oxide (446.1 g) was added at 130° C. over a period of 6 h, reaching a maximum pressure of 4.5 bar. The mixture was allowed to post react for 6 h. Afterwards ethylene oxide (469.1 g) was added at 130° C. over a period of 8 h, reaching a maximum pressure of 4.5 bar. To complete the reaction, the mixture was allowed to post-react for 6 h at 130° C. Then, the temperature was decreased to 80° C. and volatile compounds were removed in vacuum at 80° C.

Suppressor 18 was obtained as a yellow viscous product (991.2 g).

Example A19: Synthesis of Suppressor 19

Glycerine (40 g) and potassium tert-butoxide (0.07 g) were placed into a 250 mL four-necked flask under nitrogen atmosphere and heated up to 100° C. Then glycidol (100 g) was added over a period of 2 h. The mixture was allowed to post react for 4 h. A yellow, highly viscous intermediate product (314.3 g) was obtained.

The intermediate product (78.6 g) and potassium tert-butoxide (1.04 g) were placed into a 3.5 l autoclave. After nitrogen neutralization the pressure was adjusted to 1.5 bar and the mixture was homogenized at 130° C. for 1 h. Then propylene oxide (392 g) was added at 130° C. over a period of 6 h, reaching a maximum pressure of 6.5 bar. The mixture was allowed to post react for 6 h. Afterwards ethylene oxide (220.3 g) was added at 130° C. over a period of 6 h, reaching a maximum pressure of 4.2 bar. To complete the reaction, the mixture was allowed to post-react for 14 h at 130° C. Then, the temperature was decreased to 80° C. and volatile compounds were removed in vacuum at 80° C.

Suppressor 19 was obtained as a yellow viscous product (659.2 g).

Example A20: Synthesis of Suppressor 20

Pentaerythritol (45 g) dissolved in 60 ml Xylol were placed into a 250 mL four-necked flask under nitrogen atmosphere. Potassium tert-butoxide (0.07 g) was added at 70° C. Afterwards glycidol was added dropwise over a period of 2 h. The mixture was allowed to post react for 1.5 h. The volatile compounds were removed in vacuum at 80° C. A yellow, slightly viscous intermediate product (119.5 g) was obtained.

The intermediate product (64.9 g) and potassium hydoxide (5.3 g) were placed into a 3.5 l autoclave. After nitrogen neutralization the pressure was adjusted to 1.5 bar and the mixture was homogenized at 130° C. for 1 h. Then propylene oxide (566.3 g) was added at 130° C. over a period of 12 h, reaching a maximum pressure of 7.5 bar. The mixture was allowed to post react for 12 h. Afterwards ethylene oxide (429.5 g) was added at 130° C. over a period of 6 h, reaching a maximum pressure of 4.5 bar. To complete the reaction, the mixture was allowed to post-react for 12 h at 130° C. Then, the temperature was decreased to 80° C. and volatile compounds were removed in vacuum at 80° C.

Suppressor 20 was obtained as a brownish product (956.2 g).

Example A21: Synthesis of Suppressor 21

1,4-Bis(3-aminopropyl) piperazine (81.1 g) was placed into a 3.5 l autoclave. After nitrogen neutralization, the pressure was adjusted to 1.5 bar. Then glycidol (119.9 g) was added at 100° C. over a period of 2.5 h, reaching a maximum temperature of 108° C. To complete the reaction, the mixture post-react for 4 h at 100° C. Then, the temperature was decreased to 80° C. and volatile compounds were removed in vacuum at 80° C. A yellowish intermediate product was obtained (201.1 g) having an amine number of 448.5 mg KOH/g.

The intermediate product (101.5 g) and potassium tert-butoxide (1.1 g) were placed into a 3.5 l autoclave. After nitrogen neutralization, the pressure was adjusted to 1.0 bar and the mixture was homogenized at 130° C. for 1 h. Then propylene oxide (491.4 g) was added at 130° C. over a period of 6 h, reaching a maximum pressure of 5 bar. The mixture post-react for 12 h. Afterwards ethylene oxide (122.4 g) was added at 130° C. over a period of 3 h, reaching a maximum pressure of 5 bar. To complete the reaction, the mixture post-react for 6 h at 130° C. Then, the temperature was decreased to 80° C. and volatile compounds were removed in vacuum at 80° C. Surfactant 21 was obtained (715.1 g) having an amine number of 61.2 mg KOH/g.

Example A22: Synthesis of Suppressor 22

Trisaminoethylamine (33 g) was placed into 500 mL four-necked flask under nitrogen atmosphere and heated up to 100° C. Then glycidol (100 g) was added at 100° C. over a period of 2.5 h, reaching a maximum temperature of 104° C. To complete the reaction, the mixture post-react for 3.5 h at 100° C. Then, the temperature was decreased to 80° C. and volatile compounds were removed in vacuum at 80° C. A yellowish intermediate product was obtained (133.3 g) having an amine number of 388.2 mg KOH/g.

The intermediate product (80 g) and potassium tert-butoxide (0.6 g) were placed into a 3.5 l autoclave. After nitrogen neutralization, the pressure was adjusted to 1.0 bar and the mixture was homogenized at 130° C. for 1 h. Then propylene oxide (204.5 g) was added at 130° C. over a period of 7 h, reaching a maximum pressure of 5 bar. The mixture post-react for 12 h. Afterwards ethylene oxide (86.5 g) was added at 130° C. over a period of 7 h, reaching a maximum pressure of 5 bar. To complete the reaction, the mixture post-react for 10 h at 130° C. Then, the temperature was decreased to 80° C. and volatile compounds were removed in vacuum at 80° C. Surfactant 22 was obtained (244.1 g) having an amine number of 98.9 mg KOH/g.

Example A23: Synthesis of Suppressor 23

1,4-Bis(3-aminopropyl) piperazine (274 g) was placed into a 3.5 l autoclave. After nitrogen neutralization, the pressure was adjusted to 1.5 bar. Then glycidol (406 g) was added at 100° C. over a period of 15 h, reaching a maximum temperature of 110° C. To complete the reaction, the mixture post-react for 6 h at 100° C. Then, the temperature was decreased to 80° C. and volatile compounds were removed in vacuum at 80° C. A viscous yellowish intermediate product was obtained (680.4 g) having an amine number of 452.4 mg KOH/g.

The intermediate product (125 g) and potassium tert-butoxide (0.6 g) were placed into a 3.5 l autoclave. After nitrogen neutralization, the pressure was adjusted to 1.0 bar and the mixture was homogenized at 130° C. for 1 h. Then propylene oxide (340.6 g) was added at 130° C. over a period of 6 h, reaching a maximum pressure of 5 bar. The mixture post-react for 10 h. Afterwards ethylene oxide (37.7 g) was added at 130° C. over a period of 1.5 h, reaching a maximum pressure of 5 bar. To complete the reaction, the mixture post-react for 6 h at 130° C. Then, the temperature was decreased to 80° C. and volatile compounds were removed in vacuum at 80° C. Surfactant 23 was obtained (503.1 g) having an amine number of 109.4 mg KOH/g.

Example A24: Synthesis of Suppressor 24

Diethylenetriamine (100 g) dissolved in 150 ml Xylol were placed into a 2 l autoclave. After nitrogen neutralization, the reactor was heated up to 100° C. Afterwards glycidol was added dropwise over a period of 7 h, reaching a maximum temperature of 110° C. The mixture post-react for 10 h. The volatile compounds were removed in vacuum at 80° C. A intermediate product was obtained (459 g) having an amine number of 355.4 mg KOH/g.

The intermediate product (125 g) and potassium tert-butoxide (1.0 g) were placed into a 3.5 l autoclave. After nitrogen neutralization, the pressure was adjusted to 1.0 bar and the mixture was homogenized at 130° C. for 1 h. Then propylene oxide (413.9 g) and ethylene oxide (174.4 g) were added at 130° C. over a period of 12 h, reaching a maximum pressure of 4.5 bar. To complete the reaction, the mixture post-react for 15 h at 130° C. at a pressure of 7 bar. Then, the temperature was decreased to 80° C. and volatile compounds were removed in vacuum at 80° C. Surfactant 24 was obtained (713.4 g) having an amine number of 65.1 mg KOH/g.

Example B: Copper Electroplating Experiments

Example B1: Electroplating with Suppressor 1

A plating bath was prepared by combining DI water, 40 g/l copper as copper sulfate, 10 g/l sulfuric acid, 0.050 g/l chloride ion as HCl, 0.028 g/l of SPS and 3.50 ml/l of a 4.5 wt % solution in DI water of suppressor 1 as prepared in example A1.

A copper layer was electroplated onto a wafer substrate with features provided with a copper seed layer by contacting the wafer substrate with the above described plating bath at 25 degrees C. applying a direct current of −3 mA/cm$^2$ for 3.4 s. The thus electroplated copper layer was investigated by SEM inspection.

The result is shown in FIG. 1 which provides the SEM image of the copper filled trenches. The neighboring trenches are equally filled without exhibiting voids or seams in the almost fully filled trenches after 3.4 s plating as shown in FIG. 1.

Example B2: Electroplating with Suppressor 2

A plating bath was prepared by combining DI water, 40 g/l copper as copper sulfate, 10 g/l sulfuric acid, 0.050 g/l chloride ion as HCl, 0.028 g/l of SPS and 3.50 ml/l of a 4.5 wt % solution in DI water of suppressor 2 as prepared in example A2.

A copper layer was electroplated onto a wafer substrate with features provided with a copper seed layer by contacting the wafer substrate with the above described plating bath at 25 degrees C. applying a direct current of −3 mA/cm$^2$ for 3.4 s. The thus electroplated copper layer was investigated by SEM inspection.

Figure 2:
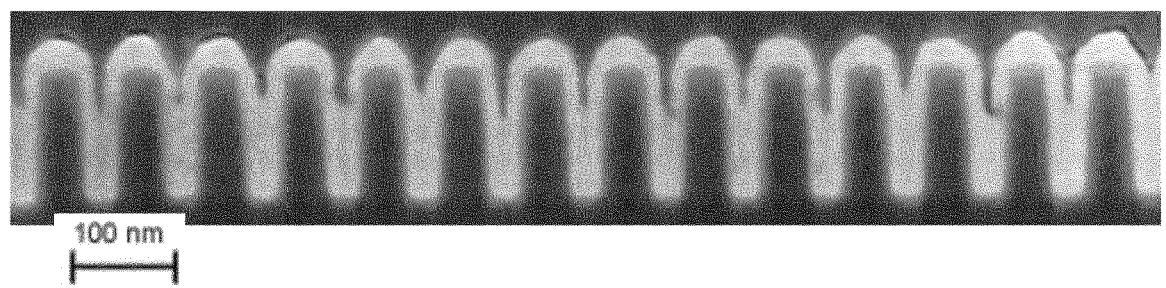
FIG. 2 shows a SEM image of partly filled trenches after copper electroplating according to example B2.

The result is shown in FIG. 2. FIG. 2 provides the SEM image of partly filled trenches exhibiting the bottom-up filling with pronounced suppression of Cu deposition at the feature opening. The neighboring trenches are almost equally filled without exhibiting voids or seams as depicted in FIG. 2. The strong suppressing effect on the trench sidewalls can be clearly seen since the small feature openings are still obvious and did not close while partially filling the trenches.

Example B3: Electroplating with Suppressor 3

A plating bath was prepared by combining DI water, 40 g/l copper as copper sulfate, 10 g/l sulfuric acid, 0.050 g/l chloride ion as HCl, 0.028 g/l of SPS, and 5.50 ml/l of a 4.6 wt % solution in DI water of suppressor 3 as prepared in example A3.

A copper layer was electroplated onto a wafer substrate with features provided with a copper seed layer by contacting the wafer substrate with the above described plating bath at 25 degrees C. applying a direct current of −3 mA/cm$^2$ for 3.4 s. The thus electroplated copper layer was investigated by SEM inspection.

Figure 3:
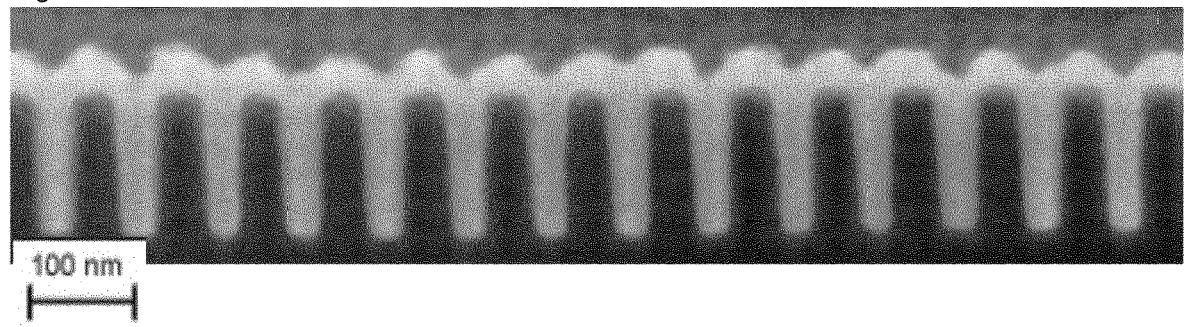
FIG. 3 shows a SEM image of fully filled trenches after copper electroplating according to example B3.

FIG. 3 shows the SEM image of the resulting electroplated copper layer. The image exhibits fully filled trenches that are free of defects like voids or seams.

Example B4: Electroplating with Suppressor 4

A plating bath was prepared by combining DI water, 40 g/l copper as copper sulfate, 10 g/l sulfuric acid, 0.050 g/l chloride ion as HCl, 0.028 g/l of SPS, and 5.50 ml/l of a 4.6 wt % solution in DI water of suppressor 4 as prepared in example A4.

A copper layer was electroplated onto a wafer substrate with features provided with a copper seed layer by contacting the wafer substrate with the above described plating bath at 25 degrees C. applying a direct current of −3 mA/cm$^2$ for 3.4 s. The thus electroplated copper layer was investigated by SEM inspection.

Figure 4:
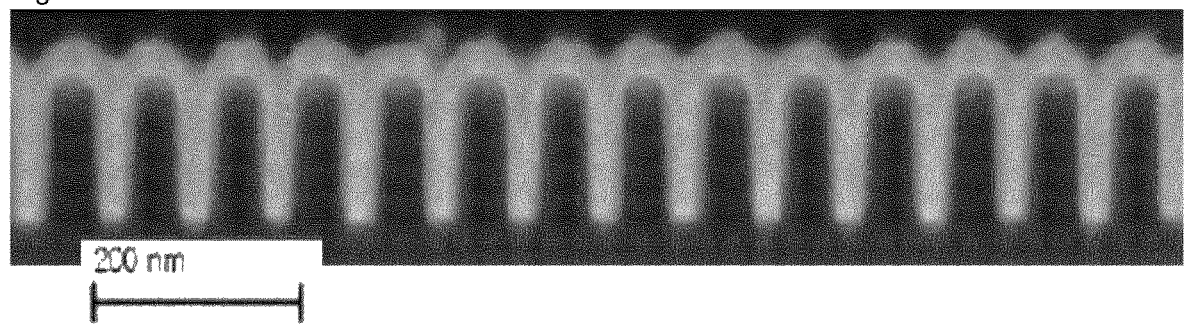
FIG. 4 shows a SEM image of fully filled trenches after copper electroplating according to example B4.

The result is shown in FIG. 4 exhibiting fully filled trenches after 3.4 s plating without any voids or seams.

Example B5: Electroplating with Suppressor 5

A plating bath was prepared by combining DI water, 40 g/l copper as copper sulfate, 10 g/l sulfuric acid, 0.050 g/l chloride ion as HCl, 0.028 g/l of SPS, and 3.00 ml/l of a 4.6 wt % solution in DI water of suppressor 5 as prepared in example A5.

A copper layer was electroplated onto a wafer substrate with features provided with a copper seed layer by contacting the wafer substrate with the above described plating bath at 25 degrees C. applying a direct current of −3 mA/cm$^2$ for 7 s. The thus electroplated copper layer was investigated by SEM inspection.

Figure 5:
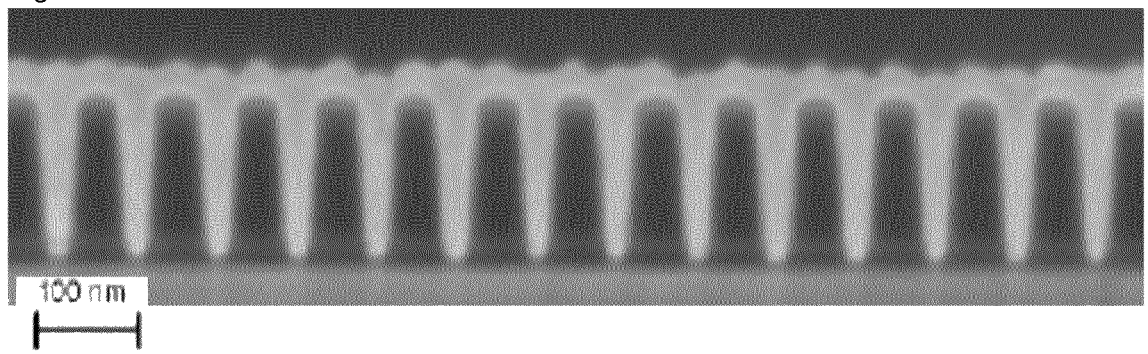
FIG. 5 shows a SEM image of fully filled trenches after copper electroplating according to example B5.

The resulting SEM image is shown in FIG. 5. After 7 s deposition time the trenches are fully filled with copper without exhibiting any defects like voids or seams.

Example B6: Electroplating with Suppressor 6

A plating bath was prepared by combining DI water, 40 g/l copper as copper sulfate, 10 g/l sulfuric acid, 0.050 g/l chloride ion as HCl, 0.028 g/l of SPS, and 3.00 ml/l of a 4.8 wt % solution in DI water of suppressor 6 as prepared in example A6.

A copper layer was electroplated onto a wafer substrate with features provided with a copper seed layer by contacting the wafer substrate with the above described plating bath at 25 degrees C. applying a direct current of −3 mA/cm$^2$ for 3.4 s or 10 s respectively. The thus electroplated copper layer was investigated by SEM inspection.

Figure 6A:
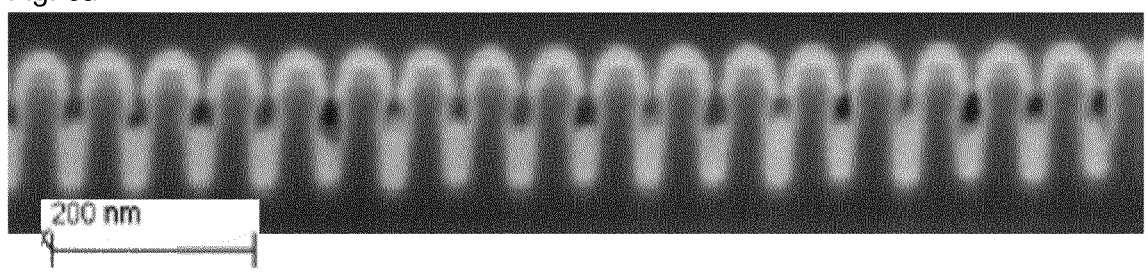
FIGS. 6a/b show SEM images of partly and fully filled trenches after copper electroplating according to example B6.
Figure 6B:
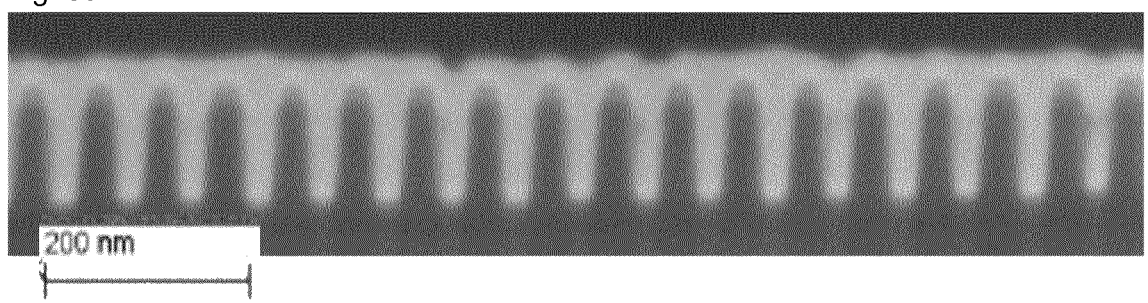

The resulting SEM images are shown in FIGS. 6a and 6b. The partly filled trenches after 3.4 s, shown in FIG. 6a, exhibit a strong suppression of the copper growth on the sidewalls of the trenches and thus a pronounced bottom-up fill. All feature openings are still open. After 10 s deposition time, shown in FIG. 6b, the trenches are fully filled exhibiting few small but still tolerable defects at the sidewall of some features. Such sidewall defects results from a thin and thus weak copper seed layer.

Example B7: Electroplating with Suppressor 7

A plating bath was prepared by combining DI water, 40 g/l copper as copper sulfate, 10 g/l sulfuric acid, 0.050 g/l chloride ion as HCl, 0.028 g/l of SPS, and 3.00 ml/l of a 4.6 wt % solution in DI water of suppressor 7 as prepared in example A7.

A copper layer was electroplated onto a wafer substrate with features provided with a copper seed layer by contacting the wafer substrate with the above described plating bath at 25 degrees C. applying a direct current of −3 mA/cm$^2$ for 10 s. The thus electroplated copper layer was investigated by SEM inspection.

Figure 7:
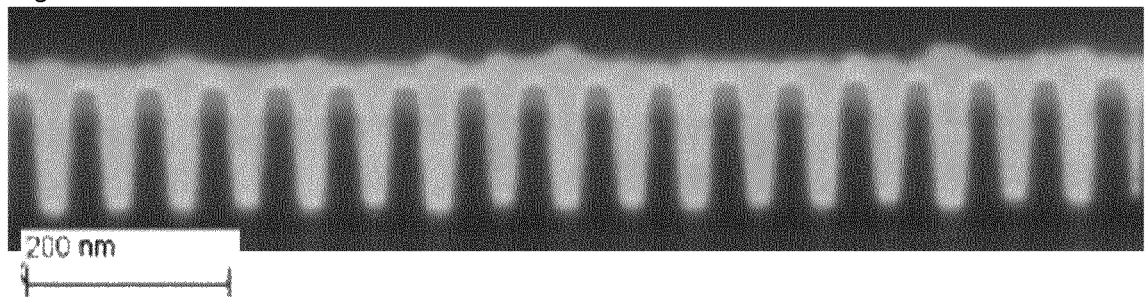
FIG. 7 shows a SEM image of fully filled trenches after copper electroplating according to example B7.

The resulting SEM image is shown in FIG. 7. After 10 s deposition time the trenches are fully filled with copper without exhibiting any defects like voids or seams.

Example B8: Electroplating with Suppressor 8

A plating bath was prepared by combining DI water, 40 g/l copper as copper sulfate, 10 g/l sulfuric acid, 0.050 g/l chloride ion as HCl, 0.028 g/l of SPS, and 8.00 ml/l of a 1.1 wt % solution in DI water of suppressor 8 as prepared in example A8.

A copper layer was electroplated onto a wafer substrate with features provided with a copper seed layer by contacting the wafer substrate with the above described plating bath at 25 degrees C. applying a direct current of −3 mA/cm$^2$ for 3.4 s or 27 s. The thus electroplated copper layer was investigated by SEM inspection.

Figure 8A:
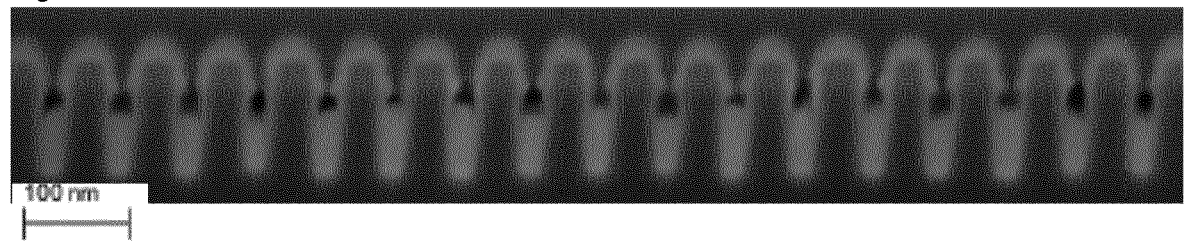
FIGS. 8a/b show SEM images of partly and fully filled trenches after copper electroplating according to example B8.
Figure 8B:
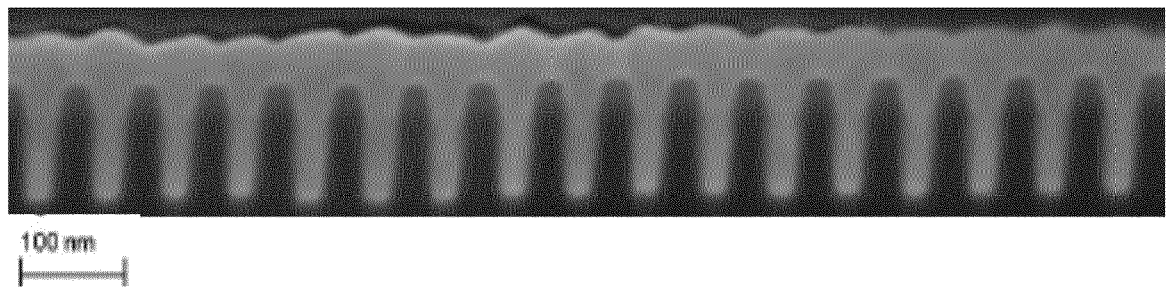

The resulting SEM images are shown in FIGS. 8a and 8b. The partly filled trenches after 3.4 s, shown in FIG. 8a, exhibit a strong suppression of the copper growth on the sidewalls of the trenches and thus a pronounced bottom-up fill. All feature openings are still open. After 27 s deposition time, shown in FIG. 8b, the trenches are fully filled without exhibiting any defects like voids.

Example B9: Electroplating with Suppressor 8

A plating bath was prepared by combining DI water, 5 g/l copper as copper sulfate, 10 g/l sulfuric acid, 0.050 g/l chloride ion as HCl, 0.028 g/l of SPS, and 8.00 ml/l of a 1.1 wt % solution in DI water of suppressor 8 as prepared in example A8.

A copper layer was electroplated onto a wafer substrate with features provided with a copper seed layer by contacting the wafer substrate with the above described plating bath at 25 degrees C. applying a direct current of −3 mA/cm$^2$ for 3.4 s or 10 s. The thus electroplated copper layer was investigated by SEM inspection.

Figure 9A:
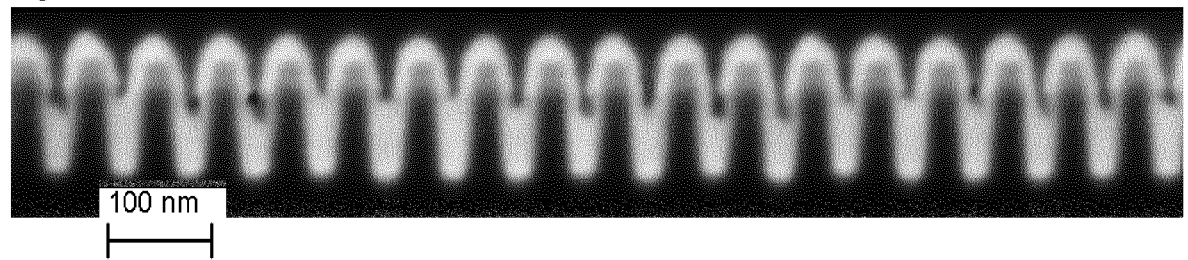
FIGS. 9a/b show SEM images of partly and fully filled trenches after copper electroplating according to example B9.
Figure 9B:
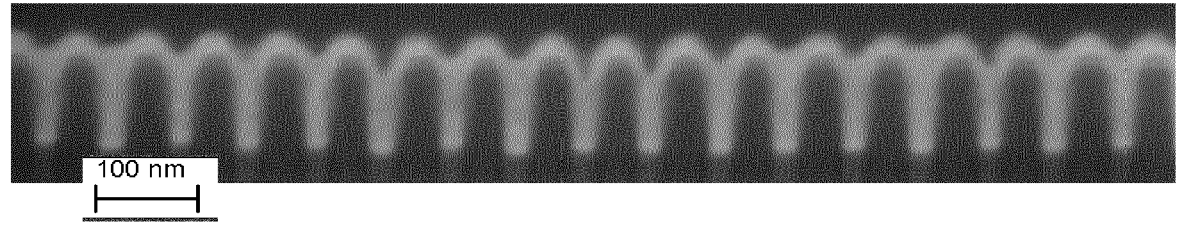

The resulting SEM images are shown in FIGS. 9a and 9b. The partly filled trenches after 3.4 s, shown in FIG. 9a, exhibit a strong suppression of the copper growth on the sidewalls of the trenches and thus a pronounced bottom-up fill. All feature openings are still open. After 10 s deposition time, shown in FIG. 9b, the trenches are fully filled without exhibiting any defects like voids or seams.

Example B10: Electroplating with Suppressor 9

A plating bath was prepared by combining DI water, 40 g/l copper as copper sulfate, 10 g/l sulfuric acid, 0.050 g/l chloride ion as HCl, 0.028 g/l of SPS, and 8.00 ml/l of a 1.1 wt % solution in DI water of suppressor 9 as prepared in example A9.

A copper layer was electroplated onto a wafer substrate with features provided with a copper seed layer by contacting the wafer substrate with the above described plating bath at 25 degrees C. applying a direct current of −3 mA/cm$^2$ for 3.4 s or 27 s. The thus electroplated copper layer was investigated by SEM inspection.

Figure 10A:
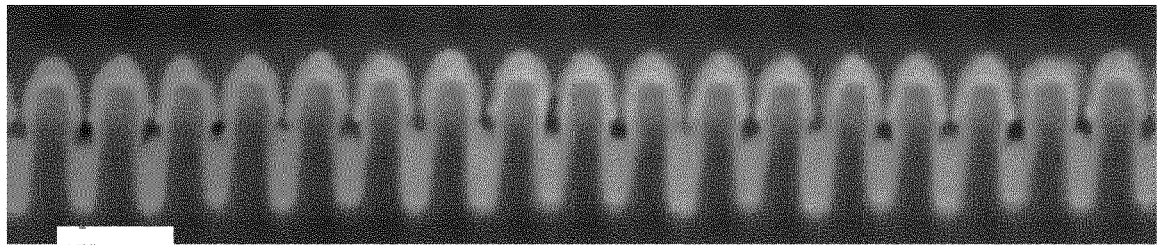
FIGS. 10a/b show SEM images of partly and fully filled trenches after copper electroplating according to example B10.
Figure 10B:
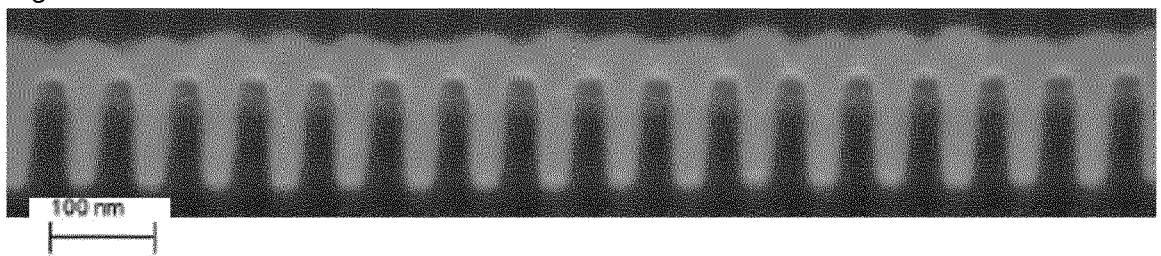

The resulting SEM images are shown in FIGS. 10a and 10b. The partly filled trenches after 3.4 s, shown in FIG. 10a, exhibit a strong suppression of the copper growth on the sidewalls of the trenches and thus a pronounced bottom-up fill. All feature openings are still open. After 27 s deposition time, shown in FIG. 10b, the trenches are fully filled without exhibiting any defects like voids or seams.

Example B11: Electroplating with Suppressor 9

A plating bath was prepared by combining DI water, 5 g/l copper as copper sulfate, 10 g/l sulfuric acid, 0.050 g/l chloride ion as HCl, 0.028 g/l of SPS, and 8.00 ml/l of a 1.1 wt % solution in DI water of suppressor 9 as prepared in example A9.

A copper layer was electroplated onto a wafer substrate with features provided with a copper seed layer by contacting the wafer substrate with the above described plating bath at 25 degrees C. applying a direct current of −3 mA/cm$^2$ for 3.4 s or 10 s. The thus electroplated copper layer was investigated by SEM inspection.

Figure 11A:
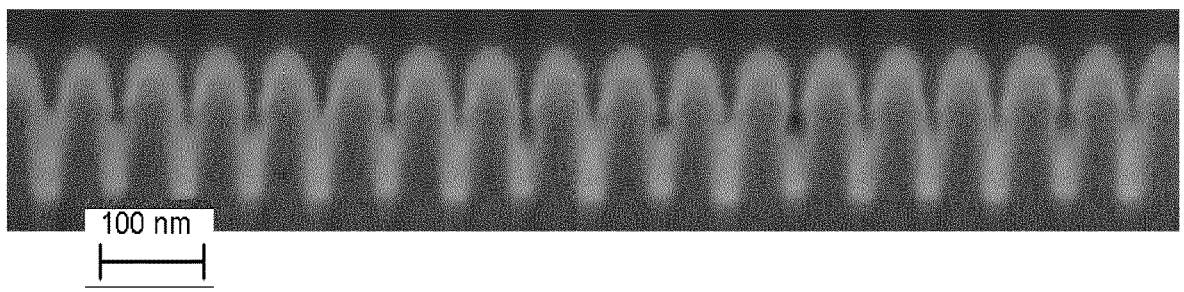
FIGS. 11a/b show SEM images of partly and fully filled trenches after copper electroplating according to example B11.
Figure 11B:
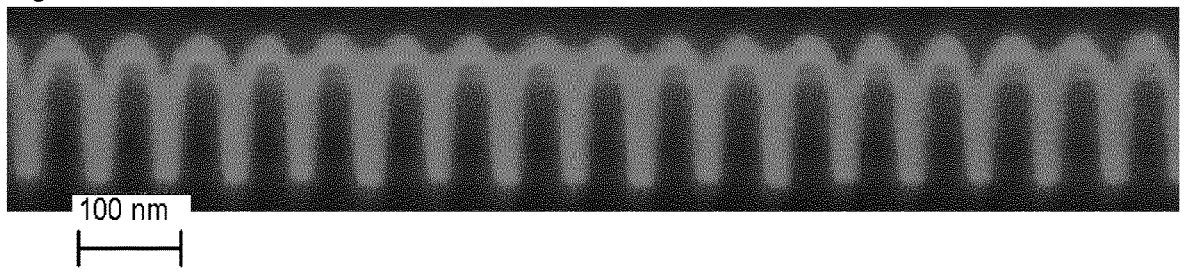

The resulting SEM images are shown in FIGS. 11a and 11b. The partly filled trenches after 3.4 s, shown in FIG. 11a, exhibit a strong suppression of the copper growth on the sidewalls of the trenches and thus a pronounced bottom-up fill. All feature openings are still open. After 10 s deposition time, shown in FIG. 11b, the trenches are fully filled without exhibiting any defects like voids or seams.

Example B12: Electroplating with Suppressor 10

A plating bath was prepared by combining DI water, 40 g/l copper as copper sulfate, 10 g/l sulfuric acid, 0.050 g/l chloride ion as HCl, 0.028 g/l of SPS, and 3.50 ml/l of a 4.3 wt % solution in DI water of suppressor 10 as prepared in example A10.

A copper layer was electroplated onto a wafer substrate with features provided with a copper seed layer by contacting the wafer substrate with the above described plating bath at 25 degrees C. applying a direct current of −3 mA/cm$^2$ for 27 s. The thus electroplated copper layer was investigated by SEM inspection.

Figure 12:
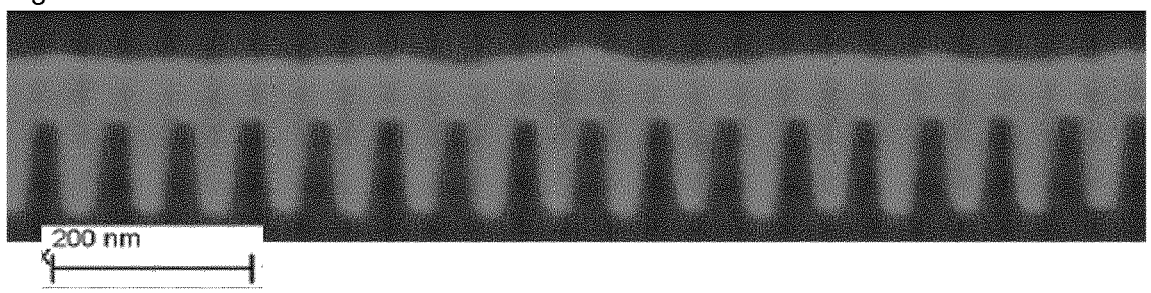
FIG. 12 shows a SEM image of fully filled trenches after copper electroplating according to example B12.

The resulting SEM image is shown in FIG. 12. After 27 s deposition time the trenches are fully filled without exhibiting any defects like voids or seams.

Example B13: Electroplating with Suppressor 11

A plating bath was prepared by combining DI water, 40 g/l copper as copper sulfate, 10 g/l sulfuric acid, 0.050 g/l chloride ion as HCl, 0.028 g/l of SPS, and 1.50 ml/l of a 4.3 wt % solution in DI water of suppressor 11 as prepared in example A11.

A copper layer was electroplated onto a wafer substrate with features provided with a copper seed layer by contacting the wafer substrate with the above described plating bath at 25 degrees C. applying a direct current of −3 mA/cm$^2$ for 10 s. The thus electroplated copper layer was investigated by SEM inspection.

Figure 13:
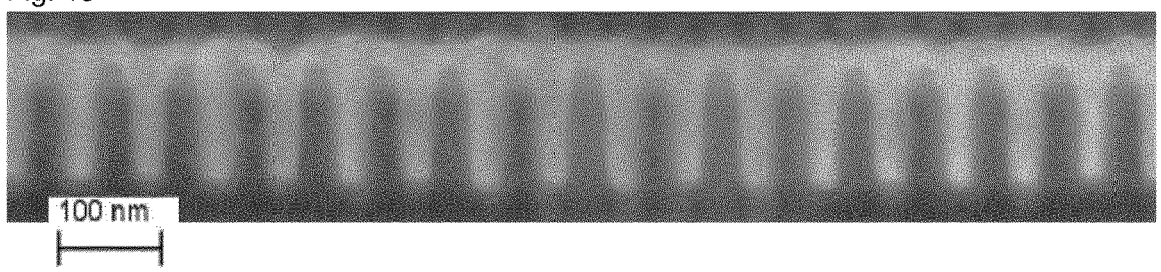
FIG. 13 shows a SEM image of fully filled trenches after copper electroplating according to example B13.

The resulting SEM image is shown in FIG. 13. After 10 s deposition time the trenches are fully filled exhibiting few small but still tolerable defects at the sidewall of some features. Such sidewall defects results from a thin and thus weak copper seed layer.

Example B14: Electroplating with Suppressor 11

A plating bath was prepared by combining DI water, 5 g/l copper as copper sulfate, 10 g/l sulfuric acid, 0.050 g/l chloride ion as HCl, 0.028 g/l of SPS, and 5.00 ml/l of a 4.3 wt % solution in DI water of suppressor 11 as prepared in example A11.

A copper layer was electroplated onto a wafer substrate with features provided with a copper seed layer by contacting the wafer substrate with the above described plating bath at 25 degrees C. applying a direct current of −3 mA/cm$^2$ for 27 s. The thus electroplated copper layer was investigated by SEM inspection.

Figure 14:
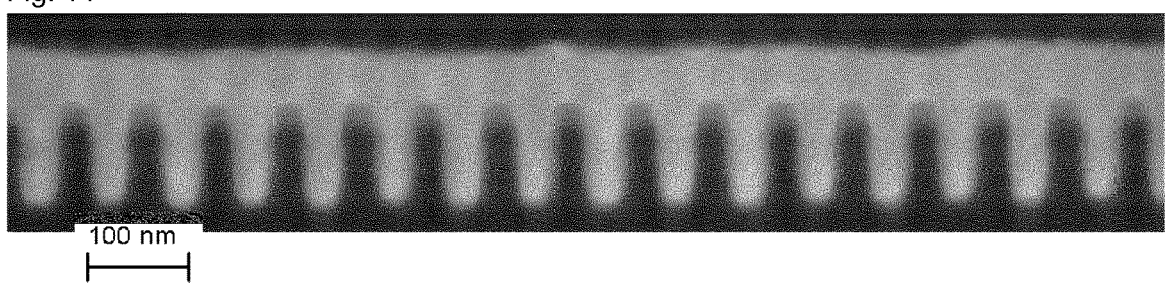
FIG. 14 shows a SEM image of fully filled trenches after copper electroplating according to example B14.

The resulting SEM image is shown in FIG. 14. After 27 s deposition time the trenches are fully filled without exhibiting any defects like voids or seams.

Example B15: Electroplating with Suppressor 12

A plating bath was prepared by combining DI water, 5 g/l copper as copper sulfate, 10 g/l sulfuric acid, 0.050 g/l chloride ion as HCl, 0.028 g/l of SPS, and 3.00 ml/l of a 4.7 wt % solution in DI water of suppressor 12 as prepared in example A12.

A copper layer was electroplated onto a wafer substrate with features provided with a copper seed layer by contacting the wafer substrate with the above described plating bath at 25 degrees C. applying a direct current of −3 mA/cm$^2$ for 27 s. The thus electroplated copper layer was investigated by SEM inspection.

Figure 15:
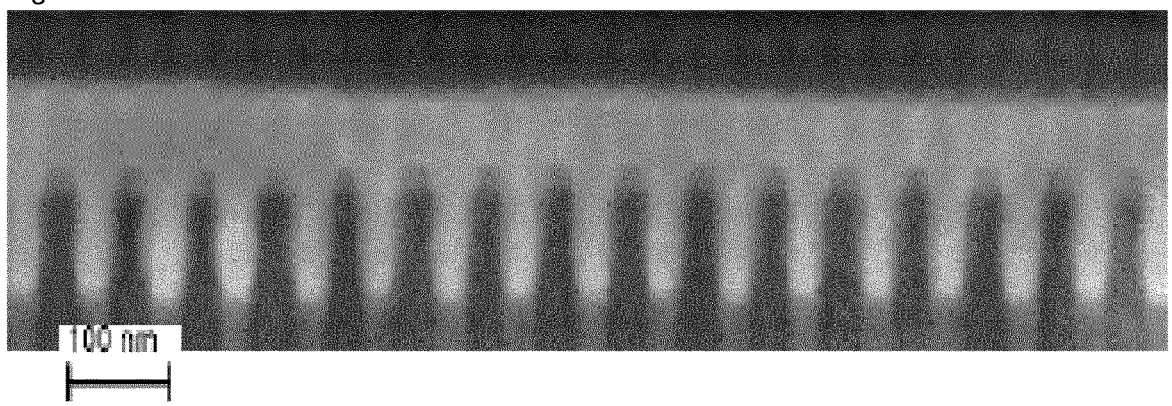
FIG. 15 shows a SEM image of fully filled trenches after copper electroplating according to example B15.

The resulting SEM image is shown in FIG. 15. After 27 s deposition time the trenches are fully filled without exhibiting any defects like voids or seams.

Example B16: Electroplating with Suppressor 13

A plating bath was prepared by combining DI water, 40 g/l copper as copper sulfate, 10 g/l sulfuric acid, 0.050 g/l chloride ion as HCl, 0.028 g/l of SPS, and 3.00 ml/l of a 4.7 wt % solution in DI water of suppressor 13 as prepared in example A13.

A copper layer was electroplated onto a wafer substrate with features provided with a copper seed layer by contacting the wafer substrate with the above described plating bath at 25 degrees C. applying a direct current of −3 mA/cm$^2$ for 27 s. The thus electroplated copper layer was investigated by SEM inspection.

Figure 16:
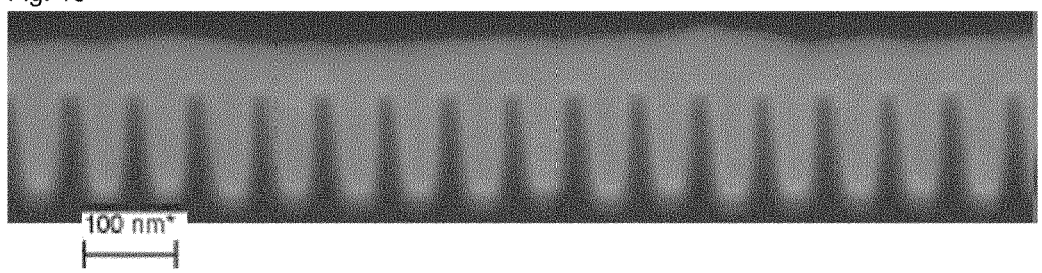
FIG. 16 shows a SEM image of fully filled trenches after copper electroplating according to example B16.

The resulting SEM image is shown in FIG. 16. After 27 s deposition time the trenches are fully filled without exhibiting any defects like voids or seams.

Example B17: Electroplating with Suppressor 13

A plating bath was prepared by combining DI water, 5 g/l copper as copper sulfate, 10 g/l sulfuric acid, 0.050 g/l chloride ion as HCl, 0.028 g/l of SPS, and 3.00 ml/l of a 4.7 wt % solution in DI water of suppressor 13 as prepared in example A13.

A copper layer was electroplated onto a wafer substrate with features provided with a copper seed layer by contacting the wafer substrate with the above described plating bath at 25 degrees C. applying a direct current of −3 mA/cm$^2$ for 27 s. The thus electroplated copper layer was investigated by SEM inspection.

Figure 17:
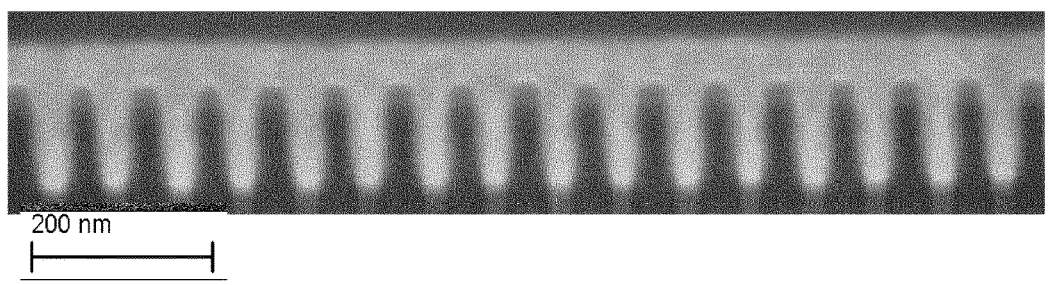
FIG. 17 shows a SEM image of fully filled trenches after copper electroplating according to example B17.

The resulting SEM image is shown in FIG. 17. After 27 s deposition time the trenches are fully filled without exhibiting any defects like voids or seams.

Example B18: Electroplating with Suppressor 14

A plating bath was prepared by combining DI water, 40 g/l copper as copper sulfate, 10 g/l sulfuric acid, 0.050 g/l chloride ion as HCl, 0.028 g/l of SPS, and 2.00 ml/l of a 5.0 wt % solution in DI water of suppressor 14 as prepared in example A14.

A copper layer was electroplated onto a wafer substrate with features provided with a copper seed layer by contacting the wafer substrate with the above described plating bath at 25 degrees C. applying a direct current of −3 mA/cm$^2$ for 27 s. The thus electroplated copper layer was investigated by SEM inspection.

Figure 18:
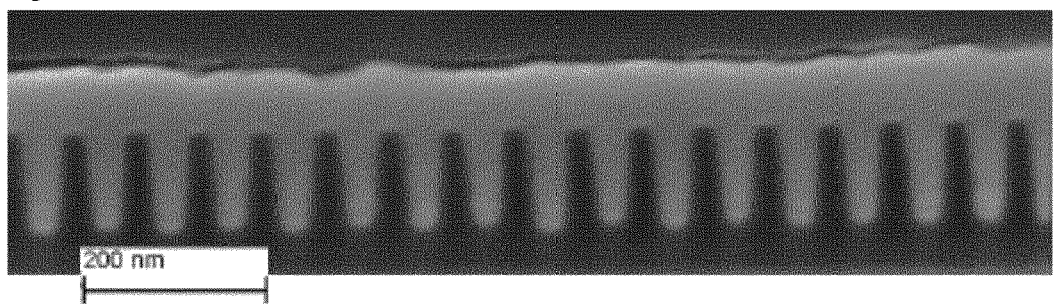
FIG. 18 shows a SEM image of fully filled trenches after copper electroplating according to example B18.

The resulting SEM image is shown in FIG. 18. After 27 s deposition time the trenches are fully filled without exhibiting any defects like voids or seams.

Example B19: Electroplating with Suppressor 15

A plating bath was prepared by combining DI water, 40 g/l copper as copper sulfate, 10 g/l sulfuric acid, 0.050 g/l chloride ion as HCl, 0.028 g/l of SPS, and 2.50 ml/l of a 4.0 wt % solution in DI water of suppressor 15 as prepared in example A15.

A copper layer was electroplated onto a wafer substrate with features provided with a copper seed layer by contacting the wafer substrate with the above described plating bath at 25 degrees C. applying a direct current of −3 mA/cm$^2$ for 3.4 s or 27 s respectively. The thus electroplated copper layer was investigated by SEM inspection.

Figure 19A:
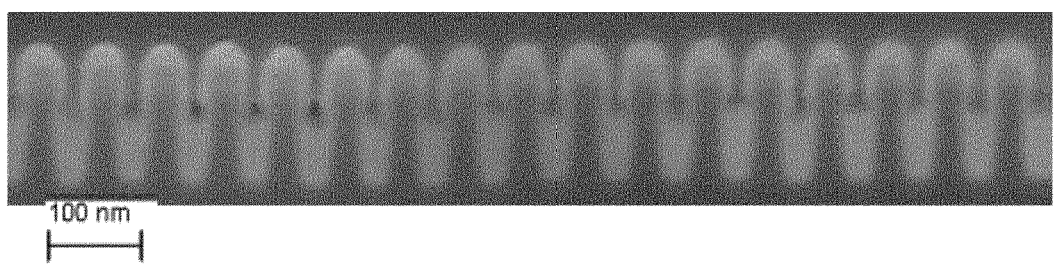
FIGS. 19a/b show SEM images of partly and fully filled trenches after copper electroplating according to example B19.
Figure 19B:
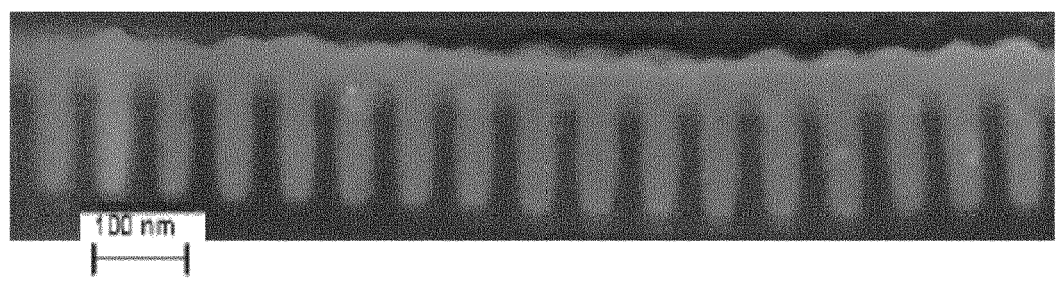

The resulting SEM images are shown in FIGS. 19a and 19b. The partly filled trenches after 3.4 s, shown in FIG. 19a, exhibit a strong suppression of the copper growth on the sidewalls of the trenches and thus a pronounced bottom-up fill. All feature openings are still open. After 27 s deposition time, shown in FIG. 19b, the trenches are fully filled without exhibiting any defects like voids or seams.

Example B20: Electroplating with Suppressor 15

A plating bath was prepared by combining DI water, 5 g/l copper as copper sulfate, 10 g/l sulfuric acid, 0.050 g/l chloride ion as HCl, 0.028 g/l of SPS, and 2.50 ml/l of a 4.0 wt % solution in DI water of suppressor 15 as prepared in example A15.

A copper layer was electroplated onto a wafer substrate with features provided with a copper seed layer by contacting the wafer substrate with the above described plating bath at 25 degrees C. applying a direct current of −3 mA/cm$^2$ for 3.4 s or 27 s respectively. The thus electroplated copper layer was investigated by SEM inspection.

Figure 20A:
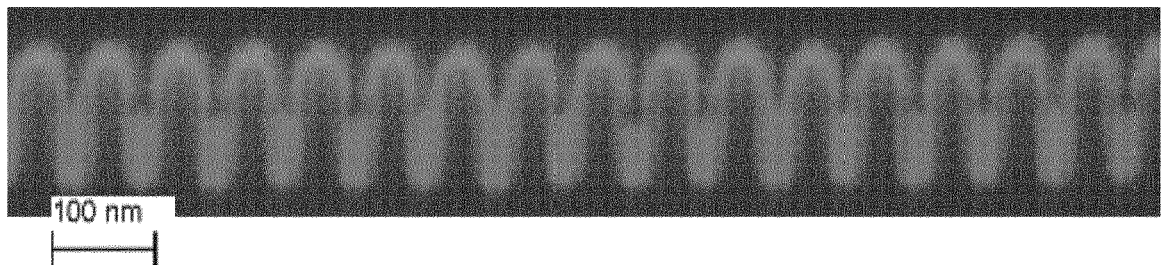
FIGS. 20a/b show SEM images of partly and fully filled trenches after copper electroplating according to example B20.
Figure 20B:
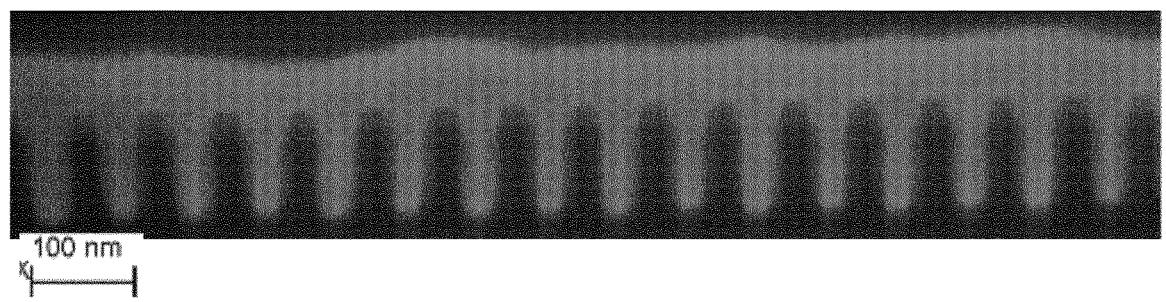

The resulting SEM images are shown in FIGS. 20a and 20b. The partly filled trenches after 3.4 s, shown in FIG. 20a, exhibit a strong suppression of the copper growth on the sidewalls of the trenches and thus a pronounced bottom-up fill. All feature openings are still open. After 27 s deposition time, shown in FIG. 20*b*, the trenches are fully filled without exhibiting any defects like voids or seams.

Example B21: Electroplating with Suppressor 16

A plating bath was prepared by combining DI water, 40 g/l copper as copper sulfate, 10 g/l sulfuric acid, 0.050 g/l chloride ion as HCl, 0.028 g/l of SPS, and 8.00 ml/l of a 1.1 wt % solution in DI water of suppressor 16 as prepared in example A16.

A copper layer was electroplated onto a wafer substrate with features provided with a copper seed layer by contacting the wafer substrate with the above described plating bath at 25 degrees C. applying a direct current of −3 mA/cm$^2$ for 27 s respectively. The thus electroplated copper layer was investigated by SEM inspection.

Figure 21:
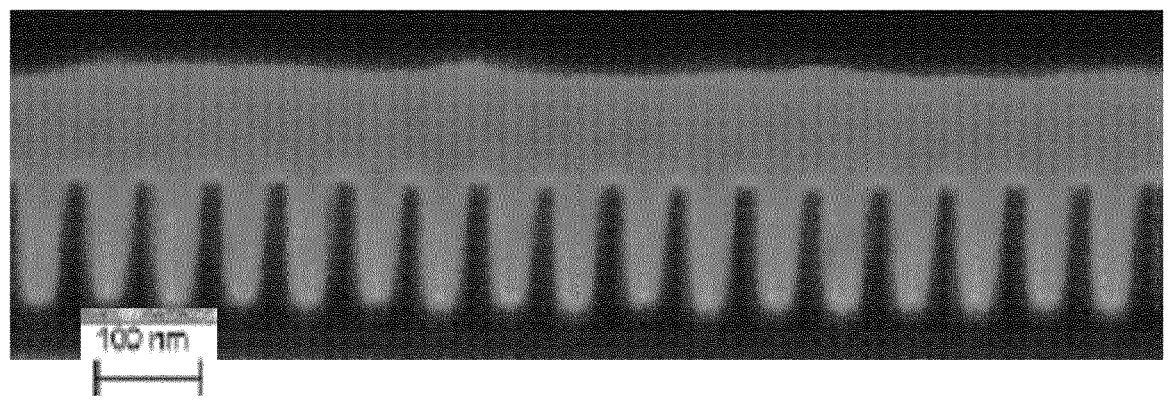
FIG. 21 shows a SEM image of fully filled trenches after copper electroplating according to example B21.

The resulting SEM image is shown in FIG. 21. After 27 s deposition time the trenches are fully filled without exhibiting any defects like voids or seams.

Example B22: Electroplating with Suppressor 17

A plating bath was prepared by combining DI water, 40 g/l copper as copper sulfate, 10 g/l sulfuric acid, 0.050 g/l chloride ion as HCl, 0.028 g/l of SPS, and 8.00 ml/l of a 1.1 wt % solution in DI water of suppressor 17 as prepared in example A17.

A copper layer was electroplated onto a wafer substrate with features provided with a copper seed layer by contacting the wafer substrate with the above described plating bath at 25 degrees C. applying a direct current of −3 mA/cm$^2$ for 27 s respectively. The thus electroplated copper layer was investigated by SEM inspection.

Figure 22:
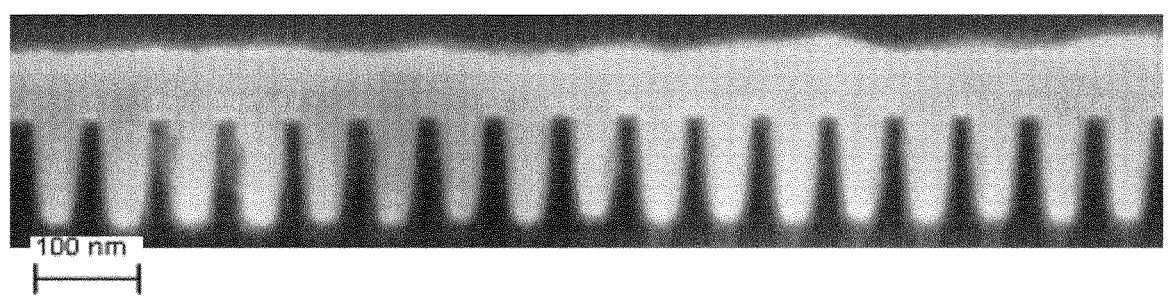
FIG. 22 shows a SEM image of fully filled trenches after copper electroplating according to example B22.

The resulting SEM image is shown in FIG. 22. After 27 s deposition time the trenches are fully filled without exhibiting any defects like voids or seams.

Example B23: Electroplating with Suppressor 18

A plating bath was prepared by combining DI water, 5 g/l copper as copper sulfate, 10 g/l sulfuric acid, 0.050 g/l chloride ion as HCl, 0.028 g/l of SPS, and 4.00 ml/l of a 1.1 wt % solution in DI water of suppressor 18 as prepared in example A18.

A copper layer was electroplated onto a wafer substrate with features provided with a copper seed layer by contacting the wafer substrate with the above described plating bath at 25 degrees C. applying a direct current of −3 mA/cm$^2$ for 27 s respectively. The thus electroplated copper layer was investigated by SEM inspection.

Figure 23:
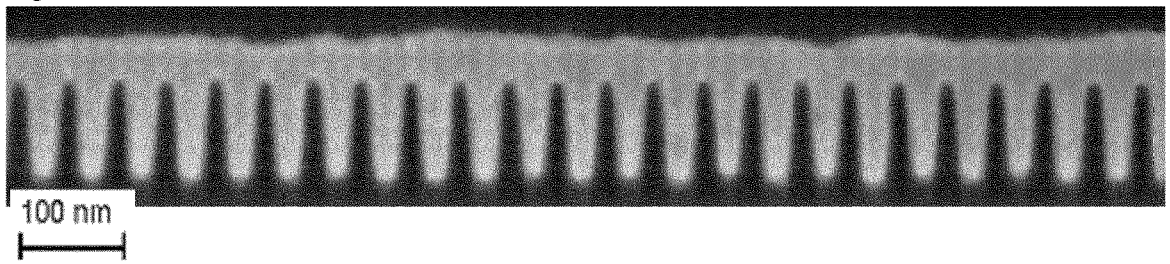
FIG. 23 shows a SEM image of fully filled trenches after copper electroplating according to example B23.

The resulting SEM image is shown in FIG. 23. After 27 s deposition time the trenches are fully filled without exhibiting any defects like voids or seams.

Example B24: Electroplating with Suppressor 18

A plating bath was prepared by combining DI water, 40 g/l copper as copper sulfate, 10 g/l sulfuric acid, 0.050 g/l chloride ion as HCl, 0.028 g/l of SPS, and 8.00 ml/l of a 1.1 wt % solution in DI water of suppressor 18 as prepared in example A18.

A copper layer was electroplated onto a wafer substrate with features provided with a copper seed layer by contacting the wafer substrate with the above described plating bath at 25 degrees C. applying a direct current of −3 mA/cm$^2$ for 27 s respectively. The thus electroplated copper layer was investigated by SEM inspection.

Figure 24:
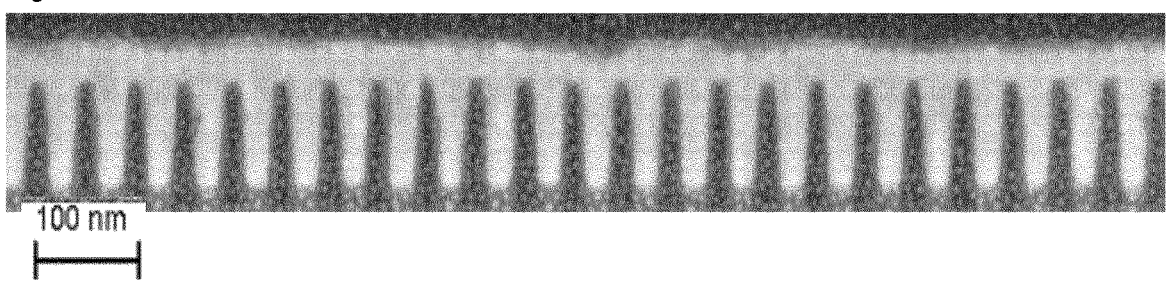
FIG. 24 shows a SEM image of fully filled trenches after copper electroplating according to example B24.

The resulting SEM image is shown in FIG. 24. After 27 s deposition time the trenches are fully filled exhibiting few small but still tolerable defects at the sidewall of some features. Such sidewall defects results from a thin and thus weak copper seed layer.

Example B25: Electroplating with Suppressor 19

A plating bath was prepared by combining DI water, 5 g/l copper as copper sulfate, 10 g/l sulfuric acid, 0.050 g/l chloride ion as HCl, 0.028 g/l of SPS, and 4.00 ml/l of a 1.1 wt % solution in DI water of suppressor 19 as prepared in example A19.

A copper layer was electroplated onto a wafer substrate with features provided with a copper seed layer by contacting the wafer substrate with the above described plating bath at 25 degrees C. applying a direct current of −3 mA/cm$^2$ for 27 s respectively. The thus electroplated copper layer was investigated by SEM inspection.

Figure 25:
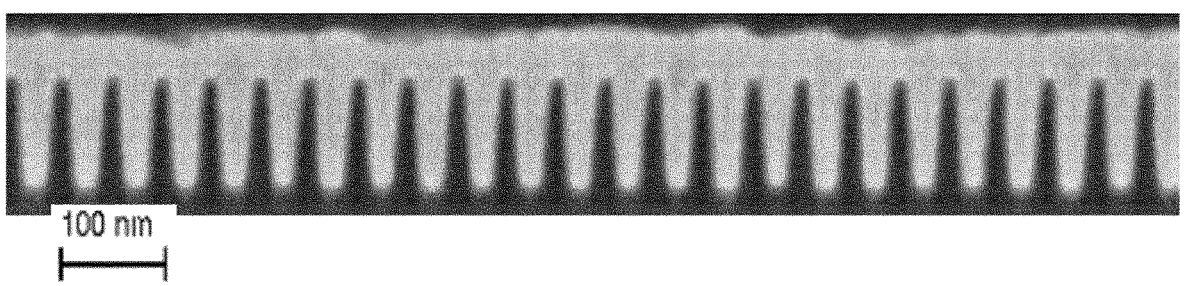
FIG. 25 shows a SEM image of fully filled trenches after copper electroplating according to example B25.

The resulting SEM image is shown in FIG. 25. After 27 s deposition time the trenches are fully filled without exhibiting any defects like voids or seams.

Example B26: Electroplating with Suppressor 19

A plating bath was prepared by combining DI water, 40 g/l copper as copper sulfate, 10 g/l sulfuric acid, 0.050 g/l chloride ion as HCl, 0.028 g/l of SPS, and 4.00 ml/l of a 1.1 wt % solution in DI water of suppressor 19 as prepared in example A19.

A copper layer was electroplated onto a wafer substrate with features provided with a copper seed layer by contacting the wafer substrate with the above described plating bath at 25 degrees C. applying a direct current of −3 mA/cm$^2$ for 27 s respectively. The thus electroplated copper layer was investigated by SEM inspection.

Figure 26:
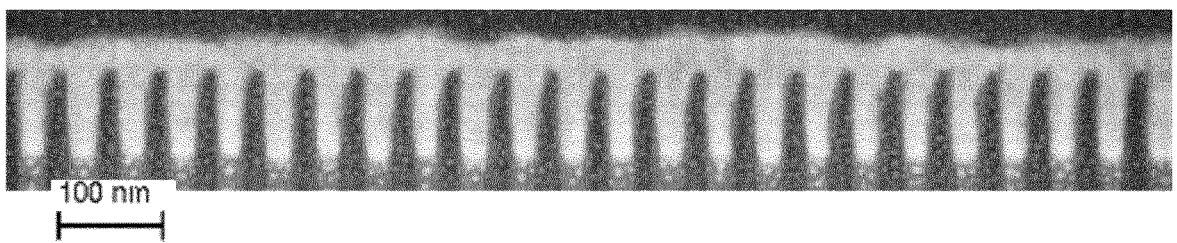
FIG. 26 shows a SEM image of fully filled trenches after copper electroplating according to example B26.

The resulting SEM image is shown in FIG. 26. After 27 s deposition time the trenches are fully filled exhibiting few small but still tolerable defects at the sidewall of some features. Such sidewall defects results from a thin and thus weak copper seed layer.

Example B27: Electroplating with Suppressor 20

A plating bath was prepared by combining DI water, 2.5 g/l copper as copper sulfate, 10 g/l sulfuric acid, 0.050 g/l chloride ion as HCl, 0.028 g/l of SPS, and 8.00 ml/l of a 1.8 wt % solution in DI water of suppressor 20 as prepared in example A20.

A copper layer was electroplated onto a wafer substrate with features provided with a copper seed layer by contacting the wafer substrate with the above described plating bath at 25 degrees C. applying a direct current of −3 mA/cm$^2$ for 27 s respectively. The thus electroplated copper layer was investigated by SEM inspection.

Figure 27:
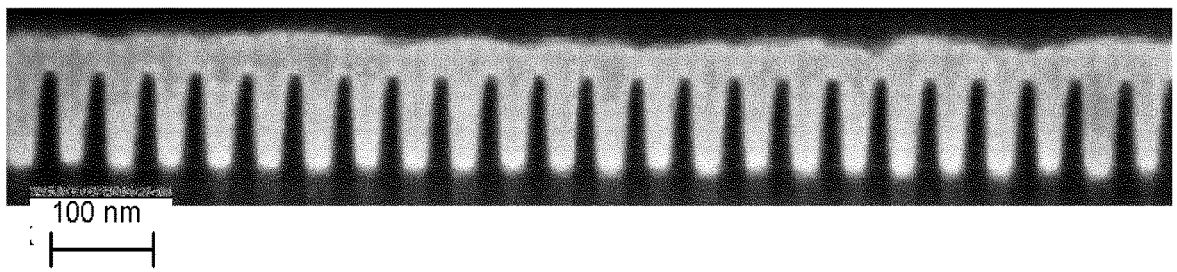
FIG. 27 shows a SEM image of fully filled trenches after copper electroplating according to example B27.

The resulting SEM image is shown in FIG. 27. After 27 s deposition time the trenches are fully filled without exhibiting any defects like voids or seams.

Example B28: Electroplating with Suppressor 20

A plating bath was prepared by combining DI water, 5.0 g/l copper as copper sulfate, 10 g/l sulfuric acid, 0.050 g/l chloride ion as HCl, 0.028 g/l of SPS, and 8.00 ml/l of a 1.8 wt % solution in DI water of suppressor 20 as prepared in example A20.

A copper layer was electroplated onto a wafer substrate with features provided with a copper seed layer by contacting the wafer substrate with the above described plating bath at 25 degrees C. applying a direct current of −3 mA/cm$^2$ for 27 s respectively. The thus electroplated copper layer was investigated by SEM inspection.

Figure 28:
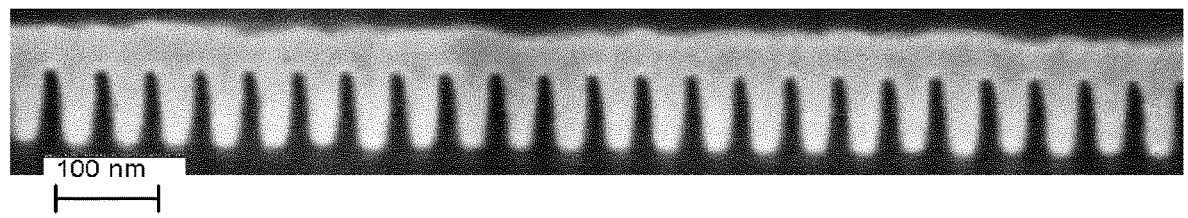
FIG. 28 shows a SEM image of fully filled trenches after copper electroplating according to example B28.

The resulting SEM image is shown in FIG. 28. After 27 s deposition time the trenches are fully filled without exhibiting any defects like voids or seams.

Example B29: Electroplating with Suppressor 20

A plating bath was prepared by combining DI water, 40.0 g/l copper as copper sulfate, 10 g/l sulfuric acid, 0.050 g/l chloride ion as HCl, 0.028 g/l of SPS, and 12.00 ml/l of a 1.8 wt % solution in DI water of suppressor 20 as prepared in example A20.

A copper layer was electroplated onto a wafer substrate with features provided with a copper seed layer by contacting the wafer substrate with the above described plating bath at 25 degrees C. applying a direct current of −3 mA/cm$^2$ for 27 s respectively. The thus electroplated copper layer was investigated by SEM inspection.

Figure 29:
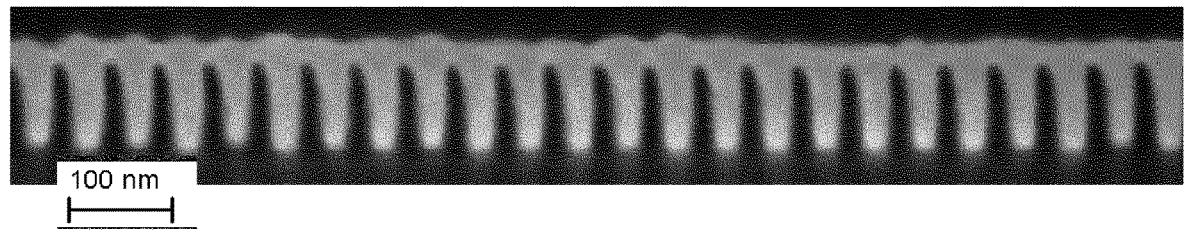
FIG. 29 shows a SEM image of fully filled trenches after copper electroplating according to example B29.

The resulting SEM image is shown in FIG. 29. After 27 s deposition time the trenches are fully filled without exhibiting any defects like voids or seams.

Example C: Tin Electroplating Experiments

Even if the suppressors for this application are usually referred to as surfactants in tin electroplating the terminology "suppressor" is also used in the following examples for the sake of clearness.

Comparative Example C1: Tin Electroplating with Prior Art Suppressor

A tin plating bath containing 40 g/l tin as tin methanesulfonate, 165 g/l methanesulfonic acid, 1 g/l of a commercial anti-oxidant and 1 g/l Lugalvan® BNO 12 (a common state of the art suppressor for tin plating, available from BASF) was prepared. Lugalvan® BNO 12 is β-naphthol ethoxylated with 12 moles ethylene oxide per mole β-naphthol.

5 µm tin was electroplated on a nickel covered copper micro-bump. The copper micro-bump had a diameter of 8 µm and a height of 5 µm. The nickel layer was 1 µm thick. A 2 cm×2 cm large wafer coupon with a 15 µm thick patterned photo resist layer has been immersed in the above described plating bath and a direct current of 16 ASD has been applied for 37s at 25° C.

The plated tin bump was examined with a laser scanning microscope (LSM). A mean roughness ($R_a$) of 0.4 µm and a coplanarity (COP) of 4% was determined. The results are summarized in Table 1.

Lugalvan BNO 12 results in a rough surface of the plated tin bump.

Comparative Example C2: Tin Electroplating with Prior Art Suppressor and Grain Refiner A tin plating bath as described for comparative example C1 containing additional 0.02 g/l benzalacetone and 10 ml/l isopropanol was prepared.

The plating procedure was the one described in comparative example C1. The plated tin bump was examined with a laser scanning microscope (LSM). A mean roughness ($R_a$) of 0.12 µm and a coplanarity (COP) of −11% was determined. The results are summarized in Table 1.

Adding benzalacetone to the plating bath of comparative example C1 leads to a smoother surface, however, accompanied with a worse coplanarity (less uniform plating height indicated by a high COP number) compared to comparative example C1.

Example C3: Tin Electroplating with Suppressor 21

A tin plating bath as described for comparative example C1 containing 1 g/l of suppressor 21 instead of Lugalvan BNO12 was used.

The plating procedure was the one described in comparative example C1. The plated tin bump was examined with a laser scanning microscope (LSM). A mean roughness ($R_a$) of 0.18 µm and a coplanarity (COP) of 2% was determined. The results are summarized in Table 1.

Comparing the roughness $R_a$ with the reference surfactant used in Comparative Example C1 tin electroplating leads to a much smoother surface when using suppressor 21. Furthermore, a comparison of the reference suppressor combined with benzalacetone used in Comparative Example C2 with suppressor 21 shows that suppressor 21 leads to a much better coplanarity.

Example C4: Tin Electroplating with Suppressor 22

A tin plating bath as described for comparative example C1 containing 1 g/l of suppressor 22 instead of Lugalvan BNO12 was used.

The plating procedure was the one described in comparative example C1. The plated tin bump was examined with a laser scanning microscope (LSM). A mean roughness ($R_a$) of 0.19 µm and a coplanarity (COP) of −2% was determined. The results are summarized in Table 1.

Comparing the roughness $R_a$ with the reference surfactant used in Comparative Example C1 tin electroplating leads to a much smoother surface when using suppressor 22. Furthermore, a comparison of the reference suppressor combined with benzalacetone used in Comparative Example C2 with suppressor 22 shows that suppressor 22 leads to a much better coplanarity.

Example C5: Tin Electroplating with Suppressor 23

A tin plating bath as described for comparative example C1 containing 1 g/l of suppressor 23 instead of Lugalvan BNO12 was used.

The plating procedure was the one described in comparative example C1. The plated tin bump was examined with a laser scanning microscope (LSM). A mean roughness ($R_a$) of 0.14 µm and a coplanarity (COP) of 1% was determined. The results are summarized in Table 1.

Comparing the roughness $R_a$ with the reference surfactant used in Comparative Example C1 tin electroplating leads to a much smoother surface when using suppressor 23. Furthermore, a comparison of the reference suppressor combined with benzalacetone used in Comparative Example C2 with suppressor 23 shows that suppressor 23 leads to a much better coplanarity.

Example C6: Tin Electroplating with Suppressor 24

A tin plating bath as described for comparative example C1 containing 1 g/l of suppressor 24 instead of Lugalvan BNO12 was used.

The plating procedure was the one described in comparative example C1. The plated tin bump was examined with a laser scanning microscope (LSM). A mean roughness ($R_a$) of 0.2 μm and a coplanarity (COP) of 1% was determined. The results are summarized in Table 1.

Comparing the roughness $R_a$ with the reference surfactant used in Comparative Example C1 tin electroplating leads to a much smoother surface when using suppressor 24. Furthermore, a comparison of the reference suppressor combined with benzalacetone used in Comparative Example C2 with suppressor 24 shows that suppressor 24 leads to a much better coplanarity.

TABLE 1

| Example | Suppressor (grain refiner) | M [g/mol] | EO [%] | Ra [μm] | COP [%] |
|---|---|---|---|---|---|
| C1 | Lugalvan BNO 12 | 672 | 100 | 0.40 | 4 |
| C2 | Lugalvan BNO 12 (Benzalaceton) | 672 | 100 | 0.12 | −11 |
| C3 | 21 | 3488 | 20 | 0.18 | 2 |
| C4 | 22 | 2736 | 30 | 0.19 | −2 |
| C5 | 23 | 2000 | 10 | 0.14 | 1 |
| C6 | 24 | 2739 | 29 | 0.20 | 1 |

The invention claimed is:

1. An aqueous composition, comprising at least one metal ion and at least one compound of formula I

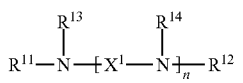

$X^1$ is independently a linear or branched $C_1$-$C_{12}$ alkanediyl, which is substituted or unsubstituted, and optionally interrupted by O, S or $NR^{40}$;

$R^{11}$ is Z, $X^5$—Z, or $X^4$—$N(Z)_2$;

Z is a branching group of formula III

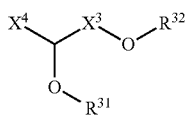

$R^{12}$ is H, $R^{11}$, or $R^{40}$;

$R^{13}$, $R^{14}$ are (a) independently H, $R^{11}$, or $R^{40}$, or (b) $R^{13}$ and an adjacent group $R^{14}$ together form a bivalent group $X^{13}$, wherein, for (a) or (b), with the provision that n>2, two adjacent groups $R^{14}$ optionally together form a bivalent group $X^{13}$;

$R^{31}$, $R^{32}$ are independently a monovalent $C_2$ to $C_6$ polyoxyalkylene group, wherein a further branching group is optionally present in $R^{31}$ and/or $R^{32}$ to form a multiple branching group $(Z^p)_p(R^{31}R^{32})_{2p}$;

$Z^p$ is

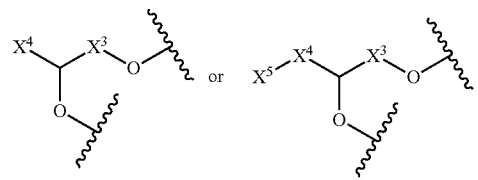

$R^{40}$ is (a) a linear or branched $C_1$-$C_{20}$ alkyl, which optionally is substituted by hydroxyl, alkoxy or alkoxycarbonyl, or (b) a linear or branched $C_1$-$C_{20}$ alkenyl, which is optionally substituted by hydroxyl, alkoxy or alkoxycarbonyl;

each $X^3$ is independently a linear or branched $C_1$ to $C_{12}$ alkanediyl, which optionally is interrupted by O and S atoms or substituted by O—$R^{31}$;

each $X^4$ is independently a linear or branched $C_1$ to $C_{12}$ alkanediyl;

each $X^5$ is independently a divalent group of at least one $C_2$ to $C_6$ polyoxyalkylene;

$X^{13}$ is a linear or branched $C_1$-$C_{12}$ alkanediyl, which optionally is interrupted by O, S or $NR^{40}$;

n is an integer of from 0 to 6; and p is an integer of from 2 to 4;

wherein the aqueous composition is for metal electroplating; and wherein the at least one metal ion comprises copper ions, cobalt ions, or tin ions.

2. The composition according to claim 1, wherein $X^1$ is a $C_1$-$C_6$ alkanediyl.

3. The composition according to claim 1, wherein $R^{31}$ and $R^{32}$ are independently a monovalent $C_2$ to $C_6$ polyoxyalkylene group.

4. The composition according to claim 1, wherein $X^3$ and $X^4$ are independently methanediyl, ethanediyl, propanediyl or butanediyl.

5. The composition according to claim 1, wherein in formula I
n is 0; and
$R^{11}$, $R^{12}$ and $R^{13}$ are independently $X^4$—$N(Z)_2$.

6. The composition according to claim 1, wherein the composition comprises a compound of formula Ia

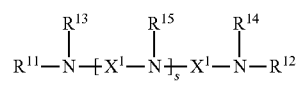

wherein
s is 0, 1, 2 or 3;
$R^{11}$, $R^{12}$, $R^{13}$ and $R^{14}$ are Z; and
$R^{15}$ is $R^{11}$ or $R^{40}$.

7. The composition according to claim 1, wherein the composition comprises a compound of formula Ia

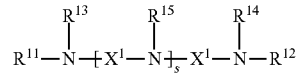

wherein
s is 0, 1, 2 or 3;
$R^{11}$ and $R^{12}$ are Z;
$R^{13}$ and $R^{14}$ are $R^{40}$; and
$R^{15}$ is $R^{11}$ or $R^{40}$;
or
s is 0, 1, 2 or 3;
$R^{11}$ and $R^{13}$ are Z; and
$R^{12}$, $R^{14}$, and $R^{15}$ are $R^{40}$.

8. The composition according to claim 1, comprising a compound of formula Ib

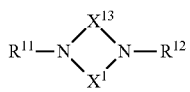
(Ib)

or a compound of formula Ic

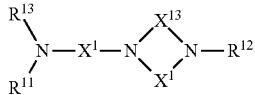
(Ic)

or a compound of 1d

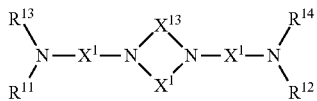
(1d)

wherein
$R^{11}$ is Z, and
$R^{12}$, $R^{13}$ and $R^{14}$ are $R^{11}$ or $R^{40}$.

9. The composition according to claim 1, wherein in formula I
n is 0; and
$R^{11}$, $R^{12}$ and $R^{13}$ are independently Z.

10. The composition according to claim 1, wherein in formula I
n is 1, 2, or 3; and
$R^{11}$, $R^{12}$, $R^{13}$, and $R^{14}$ are $X^5$—Z.

11. The composition according to claim 1, wherein the at least one metal ion comprises copper ions.

12. The composition according to claim 11, wherein
$R^{31}$, $R^{32}$ and $X^5$ are each independently a copolymer of ethylene oxide and at least one further $C_3$ to $C_6$ alkylene oxide; and
the content of ethylene oxide in $R^{31}$, $R^{32}$ and $X^5$ is from 25 to 70% by weight.

13. The composition according to claim 1, wherein the at least one metal ion comprises tin ions.

14. The composition according to claim 13, wherein
$R^{31}$, $R^{32}$ and $X^5$ are each independently a copolymer of ethylene oxide and at least one further $C_3$ to $C_6$ alkylene oxide; and
the content of ethylene oxide in $R^{31}$, $R^{32}$ and $X^5$ is from 5 to 30% by weight.

15. A method for depositing copper on a substrate, the method comprising:
applying a metal plating bath comprising the composition according to claim 11 to the substrate, which contains an aperture with a size of 30 nanometers or less.

16. A method for depositing tin or tin alloy on a substrate, the method comprising:
applying a metal plating bath comprising the composition according to claim 13 to the substrate, which contains an aperture with a size of 1 to 200 μm.

17. A process for depositing a metal layer on a substrate, the process comprising
a) contacting the composition according to claim 1 with the substrate, and
b) applying a current to the substrate for a time sufficient to perform a deposition depositing a metal layer onto the substrate,
wherein the substrate comprises micrometer or nanometer sized features and the deposition is performed to fill the micrometer or nanometer sized features.

* * * * *